(12) United States Patent
Akiyama et al.

(10) Patent No.: US 10,585,180 B2
(45) Date of Patent: *Mar. 10, 2020

(54) MANAGEMENT OF MOBILE OBJECTS

(71) Applicant: INTERNATIONAL BUSINESS MACHINES CORPORATION, Armonk, NY (US)

(72) Inventors: Kazuhito Akiyama, Machida (JP); Sanehiro Furuichi, Tokyo (JP); Gaku Yamamoto, Machida (JP)

(73) Assignee: International Business Machines Corporation, Armonk, NY (US)

( * ) Notice: Subject to any disclaimer, the term of this patent is extended or adjusted under 35 U.S.C. 154(b) by 128 days.

This patent is subject to a terminal disclaimer.

(21) Appl. No.: 15/628,797

(22) Filed: Jun. 21, 2017

(65) Prior Publication Data

US 2018/0372855 A1 Dec. 27, 2018

(51) Int. Cl.
| | |
|---|---|
| *G01S 13/06* | (2006.01) |
| *G01S 13/74* | (2006.01) |
| *G01S 15/46* | (2006.01) |
| *G08G 1/01* | (2006.01) |
| *G01C 21/36* | (2006.01) |

(Continued)

(52) U.S. Cl.
CPC .......... *G01S 13/06* (2013.01); *G01C 21/3691* (2013.01); *G01S 13/74* (2013.01); *G01S 15/46* (2013.01); *G05B 23/0237* (2013.01); *G08G 1/0112* (2013.01); *G01C 21/28* (2013.01); *G01R 31/006* (2013.01); *G01S 2015/465* (2013.01); *G05B 2219/2637* (2013.01); *G07C 5/008* (2013.01)

(58) Field of Classification Search
CPC ..... G01S 14/06; G01S 15/54; G01C 21/3679; G01C 21/3691; G01C 21/28; G05D 23/0237
USPC ........................................................ 701/408
See application file for complete search history.

(56) References Cited

U.S. PATENT DOCUMENTS

| | | |
|---|---|---|
| 4,350,970 A | 9/1982 | Von Tomkewitsch |
| 4,907,159 A | 3/1990 | Mauge |

(Continued)

FOREIGN PATENT DOCUMENTS

| | | |
|---|---|---|
| CN | 102147260 A | 8/2011 |
| CN | 102231231 A | 11/2011 |

(Continued)

OTHER PUBLICATIONS

Dictionary.com, "pertain", 2018, p. 1.

(Continued)

*Primary Examiner* — Tan Q Nguyen
(74) *Attorney, Agent, or Firm* — Dmitry Paskalov

(57) ABSTRACT

An embodiment of the invention may include a method, computer program product and computer system for managing mobile objects. The embodiment may acquire, by a first acquiring section, measurement data obtained by a first mobile object measuring the first mobile object, using a sensor of the first mobile object. The embodiment may acquire, by a second section, data obtained by a second mobile object detecting the first mobile object in response to a request from outside, using a sensor of the second mobile object. The embodiment may verify, by a verifying section, a validity of the measurement data using the detection data.

19 Claims, 22 Drawing Sheets

(51) Int. Cl.
*G05B 23/02* (2006.01)
*G01C 21/28* (2006.01)
*G01R 31/00* (2006.01)
*G07C 5/00* (2006.01)

(56) References Cited

U.S. PATENT DOCUMENTS

| | | |
|---|---|---|
| 5,164,904 A | 11/1992 | Sumner |
| 5,173,691 A | 12/1992 | Sumner |
| 5,205,697 A | 4/1993 | Getty et al. |
| 5,247,439 A | 9/1993 | Gurmu |
| 5,289,183 A | 2/1994 | Hassett |
| 5,610,821 A | 3/1997 | Gazis |
| 6,028,550 A | 2/2000 | Froeberg |
| 6,112,989 A | 9/2000 | Sheldon |
| 6,138,163 A | 10/2000 | Nam et al. |
| 6,150,961 A | 11/2000 | Alewine |
| 6,317,058 B1 | 11/2001 | Lemelson et al. |
| 6,480,783 B1 | 11/2002 | Myr |
| 6,680,674 B1 | 1/2004 | Park |
| 6,906,709 B1 | 6/2005 | Larkin |
| 7,277,938 B2 | 10/2007 | Duimovich et al. |
| 7,395,151 B2 | 7/2008 | O'Neill |
| 7,447,588 B1 | 11/2008 | Xu |
| 7,466,244 B2 | 12/2008 | Kimchi |
| 7,564,377 B2 | 7/2009 | Kimchi |
| 7,689,348 B2 | 3/2010 | Boss |
| 7,710,421 B2 | 5/2010 | Muramatsu |
| 7,788,109 B2 | 8/2010 | Jakobson |
| 7,899,611 B2 | 3/2011 | Downs |
| 7,979,172 B2 | 7/2011 | Breed |
| 8,000,887 B2 | 8/2011 | Nathan |
| 8,103,445 B2 | 1/2012 | Smith |
| 8,396,652 B2 | 3/2013 | Nomura |
| 8,428,876 B2 | 4/2013 | Lee |
| 8,606,727 B2 | 12/2013 | Wu |
| 8,612,278 B1 | 12/2013 | Ashley, Jr. |
| 8,620,510 B1 | 12/2013 | Meuth |
| 8,626,704 B2 | 1/2014 | Sawai |
| 8,630,958 B2 | 1/2014 | Carlsson |
| 8,768,012 B2 | 7/2014 | Satoh |
| 8,793,046 B2 | 7/2014 | Lombrozo |
| 8,799,246 B2 | 8/2014 | Nomura |
| 8,818,608 B2 | 8/2014 | Cullinane |
| 8,843,309 B2 | 9/2014 | Kimchi |
| 8,850,011 B2 | 9/2014 | Kimchi |
| 8,850,013 B2 | 9/2014 | Waldman |
| 8,862,146 B2 | 10/2014 | Shatsky |
| 8,903,431 B2 | 12/2014 | Koch |
| 8,903,593 B1 | 12/2014 | Addepalli et al. |
| 8,930,269 B2 | 1/2015 | He |
| 8,934,754 B2 | 1/2015 | Billau et al. |
| 8,938,443 B2 | 1/2015 | Etzion |
| 8,988,252 B2 | 3/2015 | Scholl |
| 8,989,053 B1 | 3/2015 | Skaaksrud et al. |
| 8,995,662 B2 | 3/2015 | Rubin et al. |
| 9,041,812 B2 | 5/2015 | Billau et al. |
| 9,058,703 B2 | 6/2015 | Ricci |
| 9,104,965 B2 | 8/2015 | Fritsch |
| 9,154,909 B2 | 10/2015 | Fulger et al. |
| 9,172,398 B2 | 10/2015 | Miyazaki |
| 9,280,567 B2 | 3/2016 | Fischer |
| 9,384,609 B2 | 7/2016 | Ricci |
| 9,424,521 B2 | 8/2016 | Bloomquist |
| 9,460,616 B1 | 10/2016 | Miyahira |
| 9,467,839 B1 | 10/2016 | Nishimura |
| 9,494,439 B1 | 11/2016 | Ross |
| 9,497,170 B2 | 11/2016 | Akiyama |
| 9,497,590 B1 | 11/2016 | Gotoh |
| 9,497,591 B1 | 11/2016 | Gotoh |
| 9,507,808 B2 | 11/2016 | Fischer |
| 9,513,134 B1 | 12/2016 | Ishikawa |
| 9,538,327 B1 | 1/2017 | Gotoh |
| 9,562,775 B2 | 2/2017 | Gotoh |
| 9,576,482 B2 | 2/2017 | Yamamoto |
| 9,578,093 B1 | 2/2017 | Gotoh |
| 9,584,977 B2 | 2/2017 | Yamamoto |
| 9,615,215 B2 | 4/2017 | Yuen et al. |
| 9,638,533 B2 | 5/2017 | Gotoh |
| 9,639,537 B2 | 5/2017 | Gotoh |
| 9,640,073 B2 | 5/2017 | Gueziec |
| 9,646,402 B2 | 5/2017 | Gotoh |
| 9,646,493 B2 | 5/2017 | Yamamoto |
| 9,659,016 B2 | 5/2017 | Gotoh |
| 9,674,812 B2 | 6/2017 | Skaaksrud et al. |
| 9,678,986 B2 | 6/2017 | Hancock et al. |
| 9,681,104 B2 | 6/2017 | Billau et al. |
| 9,868,394 B1 | 1/2018 | Fields et al. |
| 9,868,446 B1 | 1/2018 | Zhu et al. |
| 9,882,818 B2 | 1/2018 | Shao et al. |
| 2001/0029425 A1 | 10/2001 | Myr |
| 2002/0161833 A1 | 10/2002 | Niven |
| 2005/0027434 A1 | 2/2005 | Hirose |
| 2005/0065711 A1 | 3/2005 | Dahlgren |
| 2005/0195821 A1 | 9/2005 | Yun et al. |
| 2005/0222933 A1 | 10/2005 | Wesby |
| 2006/0158330 A1 | 7/2006 | Gueziec |
| 2007/0007780 A1 | 1/2007 | Lagiewka et al. |
| 2007/0067373 A1 | 3/2007 | Higgins |
| 2007/0109303 A1 | 5/2007 | Muramatsu |
| 2007/0208492 A1 | 9/2007 | Downs |
| 2007/0208496 A1 | 9/2007 | Downs et al. |
| 2007/0225912 A1 | 9/2007 | Grush |
| 2007/0241932 A1 | 10/2007 | Otero |
| 2008/0046134 A1 | 2/2008 | Bruce |
| 2008/0088480 A1 | 4/2008 | Rozum |
| 2008/0114530 A1 | 5/2008 | Petrisor |
| 2008/0248815 A1 | 10/2008 | Busch |
| 2008/0255754 A1 | 10/2008 | Pinto |
| 2009/0070024 A1 | 3/2009 | Burchard |
| 2009/0167597 A1 | 7/2009 | Strachan |
| 2009/0210477 A1 | 8/2009 | White |
| 2009/0248758 A1 | 10/2009 | Sawai |
| 2009/0254971 A1 | 10/2009 | Herz et al. |
| 2009/0282125 A1 | 11/2009 | Jeide |
| 2009/0287405 A1 | 11/2009 | Liu |
| 2009/0327918 A1 | 12/2009 | Aaron |
| 2010/0036578 A1 | 2/2010 | Taguchi |
| 2010/0036595 A1 | 2/2010 | Coy |
| 2010/0063715 A1 | 3/2010 | Wynter et al. |
| 2010/0069035 A1 | 3/2010 | Johnson |
| 2010/0087981 A1* | 4/2010 | Orozco-Perez ......... H04L 67/12 701/29.5 |
| 2010/0100310 A1 | 4/2010 | Eich |
| 2010/0188265 A1* | 7/2010 | Hill ..................... G08G 1/0112 340/905 |
| 2010/0199213 A1 | 8/2010 | Suzuki |
| 2011/0037619 A1 | 2/2011 | Ginsberg |
| 2011/0047230 A1 | 2/2011 | McGee |
| 2011/0137557 A1 | 6/2011 | De Los Reyes |
| 2011/0191011 A1 | 8/2011 | McBride |
| 2011/0205040 A1 | 8/2011 | Van Wiemeersch |
| 2011/0208419 A1 | 8/2011 | Boss et al. |
| 2011/0285591 A1 | 11/2011 | Wong |
| 2011/0301770 A1 | 12/2011 | Rutman |
| 2012/0035839 A1 | 2/2012 | Stehle |
| 2012/0041675 A1 | 2/2012 | Juliver |
| 2012/0065871 A1 | 3/2012 | Deshpande et al. |
| 2012/0089326 A1 | 4/2012 | Bouve |
| 2012/0092187 A1 | 4/2012 | Scholl |
| 2012/0136561 A1 | 5/2012 | Barker |
| 2012/0291049 A1 | 11/2012 | Park |
| 2012/0303222 A1 | 11/2012 | Cooprider |
| 2012/0323438 A1 | 12/2012 | Wendel |
| 2013/0002477 A1 | 1/2013 | Dehnie |
| 2013/0006531 A1 | 1/2013 | Gee |
| 2013/0006925 A1 | 1/2013 | Sawai |
| 2013/0013203 A1 | 1/2013 | Sumizawa |
| 2013/0030699 A1 | 1/2013 | Barnes |
| 2013/0079964 A1 | 3/2013 | Sukkarie |
| 2013/0104231 A1 | 4/2013 | Niner |
| 2013/0141247 A1 | 6/2013 | Ricci |
| 2013/0179382 A1 | 7/2013 | Fritsch |
| 2013/0204524 A1 | 8/2013 | Fryer |

(56) References Cited

U.S. PATENT DOCUMENTS

| | | |
|---|---|---|
| 2013/0214939 A1 | 8/2013 | Washlow |
| 2013/0219039 A1 | 8/2013 | Ricci |
| 2013/0305357 A1 | 11/2013 | Ayyagari |
| 2013/0321397 A1 | 12/2013 | Chen |
| 2013/0335233 A1* | 12/2013 | Kamar ............ A61B 5/0002 340/870.01 |
| 2014/0032015 A1 | 1/2014 | Chun et al. |
| 2014/0075004 A1 | 3/2014 | Van Dusen et al. |
| 2014/0089243 A1 | 3/2014 | Oppenheimer |
| 2014/0089375 A1 | 3/2014 | Poornachandran |
| 2014/0104077 A1 | 4/2014 | Engel et al. |
| 2014/0120953 A1 | 5/2014 | Ingram |
| 2014/0136099 A1 | 5/2014 | Choi |
| 2014/0191858 A1 | 7/2014 | Morgan |
| 2014/0195214 A1 | 7/2014 | Kozloski |
| 2014/0236414 A1 | 8/2014 | Droz |
| 2014/0248899 A1 | 9/2014 | Emadzadeh |
| 2014/0277918 A1 | 9/2014 | Kim |
| 2014/0278026 A1 | 9/2014 | Taylor |
| 2014/0278029 A1 | 9/2014 | Tonguz |
| 2014/0278074 A1 | 9/2014 | Annapureddy et al. |
| 2014/0289267 A1 | 9/2014 | Felix |
| 2014/0306834 A1 | 10/2014 | Ricci |
| 2014/0365644 A1 | 12/2014 | Tanaka |
| 2015/0032418 A1 | 1/2015 | Akiyama |
| 2015/0051822 A1 | 2/2015 | Joglekar |
| 2015/0066284 A1 | 3/2015 | Yopp |
| 2015/0112570 A1 | 4/2015 | Schmüdderich |
| 2015/0120083 A1 | 4/2015 | Gurovich |
| 2015/0127388 A1 | 5/2015 | Oldham |
| 2015/0149019 A1 | 5/2015 | Pilutti |
| 2015/0160023 A1 | 6/2015 | Goel et al. |
| 2015/0179077 A1 | 6/2015 | Morgan |
| 2015/0226858 A1 | 8/2015 | Leibner |
| 2015/0227553 A1 | 8/2015 | Dobre |
| 2015/0266455 A1 | 9/2015 | Wilson |
| 2015/0279122 A1 | 10/2015 | Lorenzen |
| 2015/0279182 A1 | 10/2015 | Kanaujia |
| 2015/0333992 A1 | 11/2015 | Vasseur |
| 2015/0349917 A1 | 12/2015 | Skaaksrud |
| 2015/0360692 A1 | 12/2015 | Ferguson |
| 2015/0371352 A1 | 12/2015 | Boss et al. |
| 2015/0375752 A1 | 12/2015 | Carlsson |
| 2016/0028632 A1 | 1/2016 | Vasseur |
| 2016/0042239 A1 | 2/2016 | Fowe |
| 2016/0061625 A1 | 3/2016 | Wang |
| 2016/0069695 A1 | 3/2016 | Broadbent |
| 2016/0076905 A1 | 3/2016 | Broadbent |
| 2016/0078756 A1 | 3/2016 | Basalamah |
| 2016/0092317 A1 | 3/2016 | Akiyama |
| 2016/0097649 A1 | 4/2016 | Broadbent |
| 2016/0112201 A1 | 4/2016 | Misawa et al. |
| 2016/0119419 A1* | 4/2016 | Choi .............. B60K 35/00 701/36 |
| 2016/0133130 A1 | 5/2016 | Grimm et al. |
| 2016/0138930 A1 | 5/2016 | Akiyama |
| 2016/0203651 A1 | 7/2016 | Heath et al. |
| 2016/0212229 A1 | 7/2016 | McGavran |
| 2016/0212601 A1 | 7/2016 | Braun et al. |
| 2016/0245660 A1 | 8/2016 | Winckler |
| 2016/0351053 A1 | 12/2016 | Jung et al. |
| 2016/0358479 A1 | 12/2016 | Riedelsheimer |
| 2016/0370185 A1 | 12/2016 | Gotoh |
| 2016/0370190 A1 | 12/2016 | Gotoh |
| 2016/0370195 A1 | 12/2016 | Gotoh |
| 2016/0370469 A1 | 12/2016 | Mabuchi |
| 2016/0371120 A1 | 12/2016 | Gotoh |
| 2016/0371281 A1 | 12/2016 | Gotoh |
| 2016/0371299 A1 | 12/2016 | Gotoh |
| 2016/0371323 A1 | 12/2016 | Gotoh |
| 2016/0371326 A1 | 12/2016 | Gotoh |
| 2016/0371864 A1 | 12/2016 | Gotoh et al. |
| 2016/0371975 A1 | 12/2016 | Yamamoto |
| 2016/0373449 A1* | 12/2016 | Haga .............. G08G 1/162 |
| 2017/0010111 A1 | 1/2017 | Gotoh et al. |
| 2017/0010112 A1 | 1/2017 | Gotoh et al. |
| 2017/0012812 A1 | 1/2017 | Gotoh et al. |
| 2017/0026858 A1 | 1/2017 | McKee |
| 2017/0067764 A1 | 3/2017 | Skupin et al. |
| 2017/0084175 A1 | 3/2017 | Sedlik |
| 2017/0178505 A1 | 6/2017 | Ishikawa et al. |
| 2017/0228410 A1 | 8/2017 | Slusar |
| 2017/0352200 A1 | 12/2017 | Wang et al. |
| 2018/0053404 A1 | 2/2018 | Horita et al. |

FOREIGN PATENT DOCUMENTS

| | | |
|---|---|---|
| CN | 102798854 A | 11/2012 |
| CN | 102997928 A | 3/2013 |
| CN | 103247176 A | 8/2013 |
| CN | 103258043 A | 8/2013 |
| CN | 103854072 A | 6/2014 |
| CN | 103971529 A | 8/2014 |
| CN | 104880722 A | 9/2015 |
| DE | 10030819 A1 | 1/2002 |
| DE | 102005020154 A1 | 11/2006 |
| EP | 1914701 A2 | 4/2008 |
| JP | 11083511 A | 3/1999 |
| JP | 2001028004 A | 1/2001 |
| JP | 2003004468 A | 1/2003 |
| JP | 2007286706 A | 11/2007 |
| JP | 2008003829 A | 1/2008 |
| JP | 2008123325 A | 5/2008 |
| JP | 2008262418 A | 10/2008 |
| JP | 2008294921 A | 12/2008 |
| JP | 2009277078 A | 11/2009 |
| JP | 4985119 B2 | 7/2012 |
| JP | 2012155286 A | 8/2012 |
| JP | 2012207919 A | 10/2012 |
| JP | 2012233800 A | 11/2012 |
| JP | 2013045242 A | 3/2013 |
| JP | 2014065362 A | 4/2014 |
| JP | 2014075008 A | 4/2014 |
| JP | 2014095663 A | 5/2014 |
| JP | 2015018396 A | 1/2015 |
| JP | 2015081057 A | 4/2015 |
| KR | 101354607 B1 | 1/2014 |
| WO | WO-2007140527 A1 | 12/2007 |
| WO | 2011081157 A1 | 7/2011 |
| WO | WO-2013167085 A2 | 11/2013 |
| WO | WO-2016203385 A1 | 12/2016 |

OTHER PUBLICATIONS

Microsoft Computer Dictionary, 5th Edition, 2002, p. 228, "function".

International Searching Authority, "Notification of Transmittal of the International Search Report and the Written Opinion of the International Searching Authority, or the Declaration," Patent Cooperation Treaty, dated Oct. 17, 2018, 31 Pages, International Application No. PCT/IB2018/0054408.

International Searching Authority, "Notification of Transmittal of the International Search Report and the Written Opinion of the International Searching Authority, or the Declaration," Patent Cooperation Treaty, dated Oct. 17, 2018, 9 Pages, International Application No. PCT/IB2018/0054409.

IBM, "List of IBM Patents or Patent Applications Treated as Related (Appendix P)," Jul. 14, 2017, p. 1-2.

U.S. Appl. No. 15/628,762, entitled "Management of Mobile Objects", filed Jun. 21, 2017, 69 Pages.

U.S. Appl. No. 15/628,787, entitled "Management of Mobile Objects", filed Jun. 21, 2017, 69 Pages.

U.S. Appl. No. 15/628,815, entitled "Management of Mobile Objects", filed Jun. 21, 2017, 74 Pages.

U.S. Appl. No. 15/629,089, entitled "Management of Mobile Objects", filed Jun. 21, 2017, 72 Pages.

U.S. Appl. No. 15/628,828, entitled "Management of Mobile Objects", filed Jun. 21, 2017, 71 Pages.

U.S. Appl. No. 15/483,415, entitled "Management of Moving Objects", filed Apr. 10, 2017, 59 Pages.

(56) References Cited

OTHER PUBLICATIONS

Abrougui et al., "Efficient load balancing and QoS-based location aware service discovery protocol for vehicular ad hoc networks," EURASIP Journal on Wireless Communications and Networking, Mar. 2012, p. 1-15, Springer.

Aulinas et al., "Local map update for large scale SLAM," Electronics Letters, Apr. 15, 2010, p. 1-2, vol. 46, No. 8.

Carson et al., "GPS Spoofing Detection and Mitigation Using Cooperative Adaptive Cruise Control System," IEEE Intelligent Vehicles Symposium (IV), Jun. 19-22, 2016, p. 1091-1096, Gothenburg, Sweden.

Dangel et al., "Can Road Traffic Volume Information Improve Partitioning for Distributed SUMO?," Modeling Mobility with Open Data, Lecture Notes in Mobility, 2015, p. 61-74, Springer International Publishing.

DRM, "Local Dynamic Map," DRM Research Seminar, Jun. 30, 2010, p. 1-72, Japan Digital Road Map Association.

Furuichi et al., "Information Sharing Among Mobile Apparatus," Application and Drawings, filed Jan. 24, 2017, 53 Pages, U.S. Appl. No. 15/413,560.

Gotoh et al., "Geographic Space Management," Application and Drawings, filed Mar. 2, 2017, 93 Pages, U.S. Appl. No. 15/447,594.

Gotoh et al., "Management of Mobile Objects," Application and Drawings, filed Dec. 16, 2015, 65 Pages, U.S. Appl. No. 14/970,631.

He et al., "Sharing Trajectories of Autonomous Driving Vehicles to Achieve Time-Efficient Path Navigation," IEEE Vehicular Networking Conference, 2013, p. 119-126.

Hong et al., "A grid-based node split algorithm for managing current location data of moving objects," The Journal of Supercomputing, Dec. 2007, p. 321-337, vol. 42, Issue 3, Springer.

Hsu et al., "Automatic Traffic Monitoring Method Based on Cellular Model," Fifth International Conference on Intelligent Information Hiding and Multimedia Signal Processing, 2009, p. 640-643, IEEE Computer Society.

IEEE, "Server—Definition," IEEE 100: The Authoritative Dictionary of IEEE Standards Terms, 2000, p. 1031, Seventh Edition.

IEEE, "System—Definition," IEEE 100: The Authoritative Dictionary of IEEE Standards Terms, 2000, p. 1143-1144, Seventh Edition.

Ihm et al., "Advanced Spatial Data Management for Enterprise Applications," An Oracle White Paper, Aug. 2010, p. 1-16, Oracle Spatial 11g.

International Searching Authority, "Notification of Transmittal of the International Search Report and the Written Opinion of the International Searching Authority, or the Declaration," Patent Cooperation Treaty, Sep. 21, 2016, 11 Pages, International Application No. PCT/IB2016/053523.

Ishikawa et al., "Management of Mobile Objects and Resources," Application and Drawings, filed Mar. 1, 2017, 56 Pages, U.S. Appl. No. 15/446,359.

Ishikawa et al., "Management of Mobile Objects and Resources," Application and Drawings, filed Dec. 16, 2015, 52 Pages, U.S. Appl. No. 14/970,626.

Ishikawa et al., "Management of Mobile Objects," Application and Drawings, filed Dec. 16, 2015, 78 Pages, U.S. Appl. No. 14/970,643.

Kattan et al., "Time-Series Event-Based Prediction: An Unsupervised Learning Framework Based on Genetic Programming," Information Sciences, Aug. 17, 2014, p. 1-38.

Liao et al., "Anomaly Detection in GPS Data Based on Visual Analytics," IEEE Symposium on Visual Analytics Science and Technology, Oct. 24-29, 2010, p. 51-58, Salt Lake City, Utah, USA.

Merriam-Webster, "placeholder", Merriam-Webster Dictionary, 2017, 1 Page.

Microsoft, "select," Microsoft Computer Dictionary, 2002, p. 471, 2nd Edition.

Miyahira et al., "Management of Mobile Objects and Service Platform for Mobile Objects," Application and Drawings, filed Jul. 14, 2016, 68 Pages, U.S. Appl. No. 15/210,178.

Miyahira et al., "Management of Mobile Objects and Service Platform for Mobile Objects," Application and Drawings, filed Jul. 14, 2016, 68 Pages, U.S. Appl. No. 15/210,207.

Narayanan et al., "Using Data Analytics to Detect Anomalous States in Vehicles," arXiv AI: Artificial Intelligence, Dec. 25, 2015, p. 1-10, arXiv:1512.08048 [cs.AI], Cornell University Library.

Nishimura et al., "Management of Dynamic Events and Moving Objects," Application and Drawings, filed Sep. 1, 2016, 91 Pages, U.S. Appl. No. 15/254,183.

OpenStreetMap, "QuadTiles," OpenStreetMap Wiki, Last Modified on Mar. 3, 2014, p. 1-10, http://wiki.openstreetmap.org/wiki/QuadTiles, Accessed on Jun. 15, 2015.

Ortelli, "Server-side clustering of geo-points on a map using Elasticsearch," Trifork Blog, Aug. 1, 2013, p. 1-14, http://blog.trifork.com/2013/08/01/server-side-clustering-of-geo-points-on-a-map-using-elasticsearch/, Accessed on Jun. 15, 2015.

Pawlowski et al., "Applying Event Stream Processing on Traffic Problem Detection," Progress in Artificial Intelligence (EPAI), 2009, p. 27-38, LNAI vol. 5816, Springer-Verlag Berlin Heidelberg.

Radin, "GPS Spoofing Detection Using Multiple Antennas and Individual Space Vehicle Pseudoranges," Open Access Master's Theses, 2015, p. 1-99, Paper 528, DigitalCommons@URI, University of Rhode Island.

Schade, "Sharing Data by Means of a Local Dynamic Map," Understanding the Standards for Cooperative ITS, Feb. 6, 2014, p. 1-10, MINES ParisTech, Transportation Sustainability Environment Consulting.

Sun et al., "Moving Object Map Analytics: A Framework Enabling Contextual Spatial-Temporal Analytics of Internet of Things Applications," IEEE International Conference on Service Operations and Logistics, and Informatics (SOLI), 2016, p. 101-106.

Suzumura et al., "X10-based Massive Parallel Large-Scale Traffic Flow Simulation," ProVISION, Winter 2012, p. 74-79, No. 72, IBM Professionals' Papers.

Y et al., "A Complex Event Processing System Approach to Real Time Road Traffic Event Detection," Journal of Convergence Information Technology (JCIT), Oct. 2013, p. 142-148, vol. 8, No. 15.

Yamamoto, "Management of Moving Objects," Application and Drawings, filed Apr. 10, 2017, 59 Pages, U.S. Appl. No. 15/483,415.

Yang et al., "Detecting Road Traffic Events by Coupling Multiple Timeseries With a Nonparametric Bayesian Method," IEEE Transactions on Intelligent Transportation Systems, Oct. 2014, p. 1936-1946, vol. 15, No. 5.

Yang et al., "Spatio-temporal Coupled Bayesian Robust Principal Component Analysis for Road Traffic Event Detection," Proceedings of the 16th International IEEE Annual Conference on Intelligent Transportation Systems (ITSC 2013), Oct. 6-9, 2013, p. 392-398, IEEE, The Hague, The Netherlands.

Yim et al., "Investigation of Vehicles as Probes Using Global Positioning System and Cellular Phone Tracking: Field Operational Test," California PATH Working Paper, Feb. 2001, p. 1-50, California Path Program Institute of Transportation Studies, University of California, Berkeley, CA.

Yumak et al., "Modelling Multi-Party Interactions among Virtual Characters, Robots, and Humans", Presence: Teleoperators & Virtual Environments, Spring 2014, p. 172-190, vol. 23, No. 2.

Merriam-Webster Dictionary, "Candidate", 2017, p. 1.

Microsoft Computer Dictionary, "Object" 5th Edition, 2002, p. 372.

Pending U.S. Appl. No. 15/903,084, filed Feb. 23, 2018, entitled: "Management of Mobile Objects", pp. 1-69.

IBM: List of IBM Patents or Patent Applications Treated as Related (Appendix P), Mar. 2, 2018, pp. 1-2.

Pending U.S. Appl. No. 15/855,408, filed Dec. 27, 2017, entitled: "Management of Mobile Objects", pp. 1-68.

Pending U.S. Appl. No. 15/855,238, filed Dec. 27, 2017, entitled: "Management of Mobile Objects", pp. 1-71.

Pending U.S. Appl. No. 15/855,159, filed Dec. 27, 2017, entitled: "Management of Mobile Objects", pp. 1-69.

* cited by examiner

| Edge ID | Event ID | Location | Event Content | Influence Event |
|---|---|---|---|---|
| Edge 0001 | Eve 0214 | Full Length | Speed Limited to 30km/h | Eve 0114(Edge 0002) |
| Edge 0002 | Eve 0114 | 32m from the 1st node | Closure | Eve 0214(Edge 0001), Eve 0421(Edge 0003)... |
| ⋮ | ⋮ | ⋮ | ⋮ | ⋮ |
| Edge 1000 | N/A | - | - | Eve 1201 (edge xxxx) |

Event List

FIG.9

| Edge ID | Counts | Location | Event Content |
|---|---|---|---|
| Edge 0009 | 2 | Full length | Congestion |
| Edge 0013 | 1 | 15m from the 2$^{nd}$ node | Skid |
| ⋮ | ⋮ | ⋮ | |

Candidate Event List

FIG.10

| Edge ID | Event ID | Location | Event Content |
|---|---|---|---|
| Edge 0001 | Eve 0214 | Full Length | Speed Limited to 30km/h |
| Edge 0002 | Eve 0114 | 32m from the 1st node | Closure |

Notification Event List

FIG.11

MANAGEMENT OF MOBILE OBJECTS

BACKGROUND

The present invention relates to management of the movement of mobile objects.

Conventionally, a high-speed driving support and automobile system is known that receives information by communicating with a plurality of automobiles, acquires information concerning accidents or obstructions on the road and maps this information onto a map along with the position of an automobile, and references automobile position information, automobile characteristic information, driver characteristic information, and the like, and transmits suitable event information to each automobile.

The hardware and software installed in the vehicles using such a system are often primitive, and are therefore easy to modify and alter. Furthermore, there are cases where viruses, malware, or the like are installed in the hardware or software that is installed in the automobiles. In such a case, transmission of falsified data against the will of the user, attacks on the system, or the like can occur. Such attacks on the system or the like destabilize the operation of the system, and alteration, falsification, or the like of driving records causes a drop in the reliability of the system.

SUMMARY

An embodiment of the invention may include a method, computer program product and computer system for managing mobile objects. The embodiment may acquire, by a first acquiring section, measurement data obtained by a first mobile object measuring the first mobile object, using a sensor of the first mobile object. The embodiment may acquire, by a second section, data obtained by a second mobile object detecting the first mobile object in response to a request from outside, using a sensor of the second mobile object. The embodiment may verify, by a verifying section, a validity of the measurement data using the detection data.

BRIEF DESCRIPTION OF THE DRAWINGS

FIG. 9 shows an illustrative example of an event list.

FIG. 10 shows an illustrative example of a candidate event list.

FIG. 11 shows an illustrative example of a notification event list.

DETAILED DESCRIPTION

Embodiments of the present invention will now be described in detail with reference to the accompanying Figures.

Figure 1:
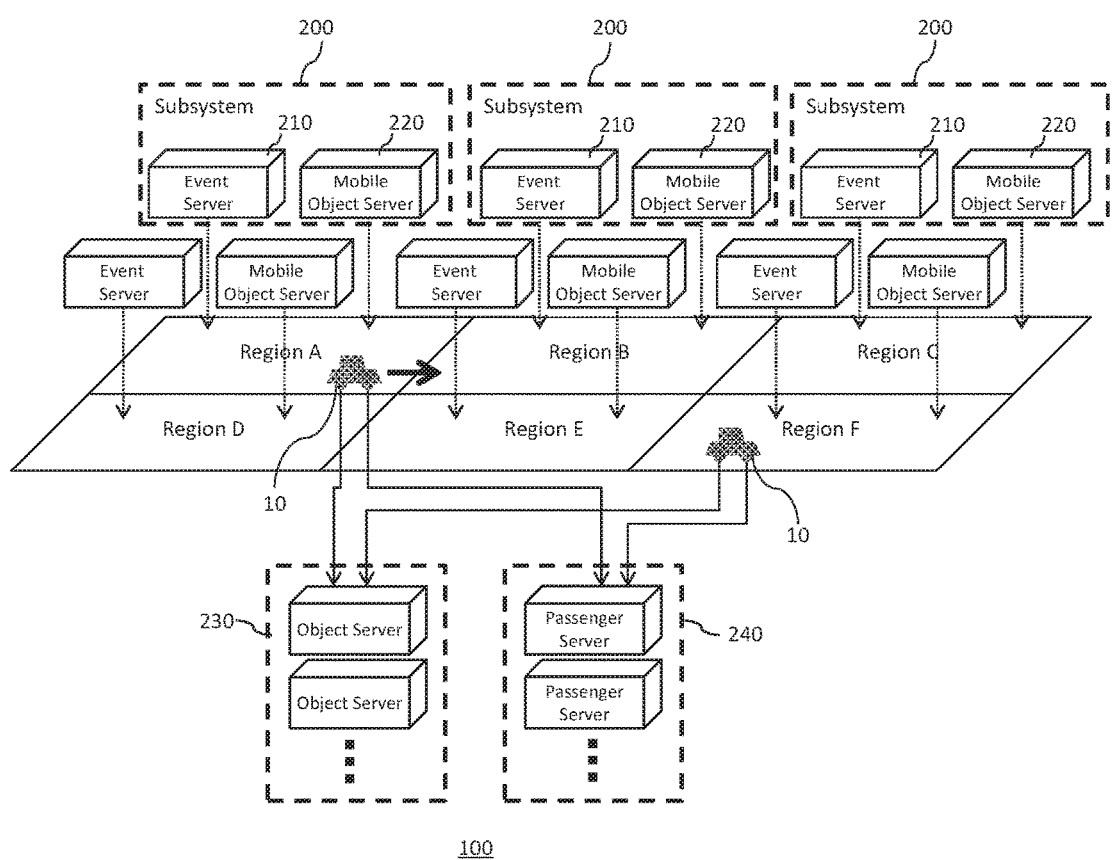
FIG. 1 shows a system 100 according to an embodiment of the present invention and a map area corresponding to a geographic space managed by the system 100.

FIG. 1 shows a system 100 and a map area corresponding to a geographic space managed by the system 100, according to an embodiment of the present invention. The system 100 manages a geographic space that includes routes on which a mobile object 10 moves. The system 100 is operable to divide the geographic space into a plurality of regions and manage these regions. A mobile object 10 may move on routes including land routes, sea routes, and/or air routes, for example. The geographic space may be land, sea, or air space that includes the routes on which the mobile object travels. The mobile objects 10 may be manned/unmanned automobiles, motorbikes, bicycles, humans having a digital device, airplanes, vessels, drones, or the like.

FIG. 1 shows an automobile as an example of the mobile object 10, which moves along roads as examples of land routes. The system 100 includes a plurality of subsystems 200 that respectively manage the plurality of regions. FIG. 1 shows an example in which the map area is divided into six regions from region A to region F, and six subsystems 200 respectively manage these six regions.

System 100 comprises a plurality of event servers 210, a plurality of mobile object servers 220, a plurality of object servers 230, and a plurality of passenger servers 240. According to the embodiment of FIG. 1, each of the subsystems 200 may include at least one of the plurality of event servers 210 and one of the plurality of mobile object servers 220.

The event server 210 manages events occurring in each region of the geographic space. In one embodiment, the event server 210 of subsystem 200 assigned to region A may manage events in region A. The plurality of mobile object servers 220 respectively assigned to a plurality of regions in a geographic space manage the mobile objects 10 in each of the plurality of regions. In one embodiment, the mobile object server 220 assigned to region A may manages mobile objects 10 located in region A. The object server 230 manages information of the mobile objects 10 regardless of the location of the mobile objects 10. The passenger server 240 manages information of at least one passenger riding on the mobile objects 10.

Each of the subsystems 200 may be implemented on one or more servers. In one embodiment, each event server 210 and mobile object server 220 may be implemented on one server. In one embodiment, a set of an event server 210 and a mobile object server 220 in a subsystem 200 may be implemented by one server. Portions of the system 100 other than the subsystems 200 may also be implemented on one or more servers. In one embodiment, each object server 230 and passenger server 240 may be implemented on one server. In another embodiment, a set of object servers 230 and a set of passenger servers 240 may be each implemented by one server. In yet another embodiment, all of the object servers 230 and the passenger servers 240 may be implemented on one server. These servers may exist at any point on a network including the Internet, a subscriber network, a cellular network, or a desired combination of networks. The servers may be computers or other types of data processors, and may be dedicated servers, or may be shared servers that perform other operations.

The system 100 acquires the positions of a mobile object 10 from the mobile object 10, and the mobile object server 220 managing the region that includes the acquired position of the mobile object 10 may manage the movement of this mobile object 10. The system 100 acquires information of events that have occurred to the mobile object 10 and/or on the road outside, and the event server 210 managing the region including the position where such an event has occurred may manage the state of the event.

This event may include information about accidents, obstructions, closure, limitation, status, or construction on the road, or information about the weather, temperature, buildings, shops, or parking lots near the road. In response to a setting or a request from the mobile object 10, the subsystem 200 may provide notification about the event information to the mobile object 10 that made the request. For example, if the mobile object 10 is moving on a route in a geographical area corresponding to region A, then the mobile object server 220 managing region A provides this mobile object 10 with the notification about the event relating to the route.

Since the map area is divided into a plurality of regions, despite the mobile object 10 simply moving on a route, the region corresponding to the position of the mobile object 10 might change. FIG. 1 shows an example in which the mobile object 10 is driving on a road such that the position of the mobile object 10 moves from region A to region B on the regions. In this case, according to the movement of the mobile object 10, the system 100 may transfer the information concerning the mobile object 10 from the mobile object server 220 managing region A to the mobile object server 220 managing region B, and may also transfer the management of the mobile object 10 to the mobile object server 220 managing region B.

Figure 2:
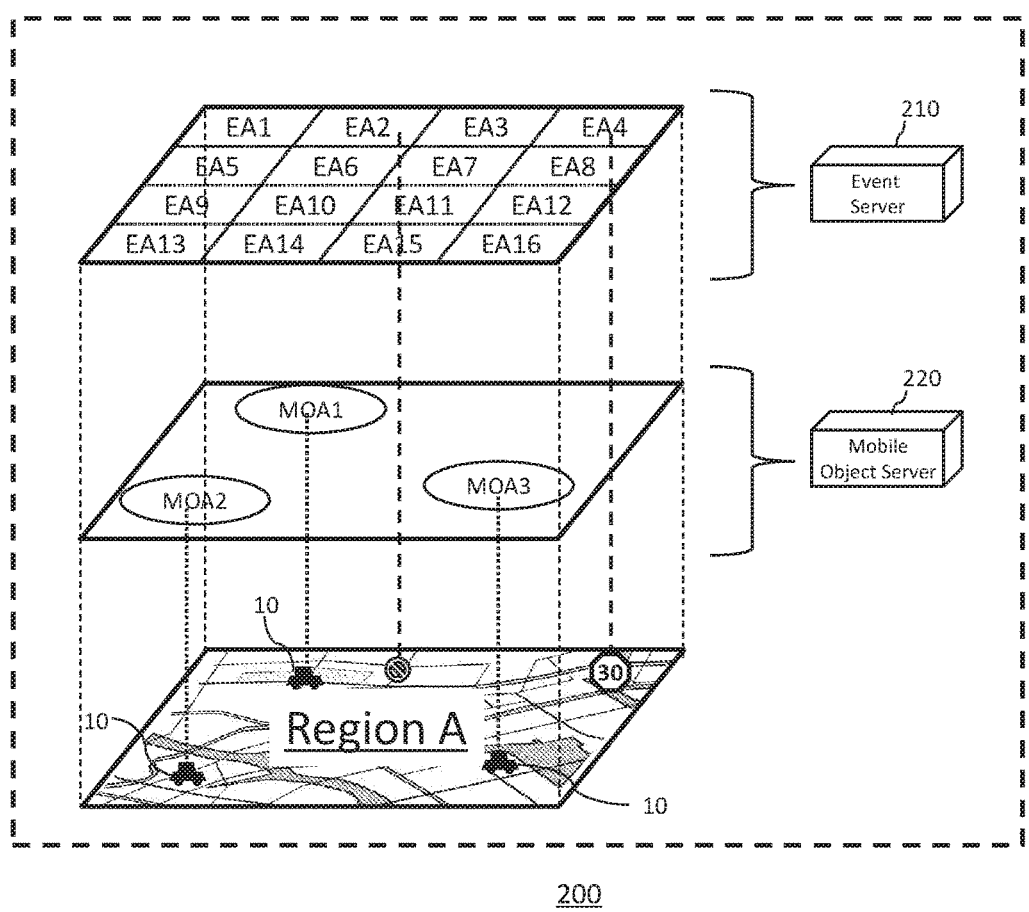
FIG. 2 shows a subsystem 200 according to the embodiment of the present invention and a map area corresponding to a region A managed by the subsystem 200.

FIG. 2 shows a subsystem 200 and a map area corresponding to a region A managed by the subsystem 200, according to an embodiment of the present invention. The event server 210 manages at least one event agent, and executes each event agent to manage events on routes in a region assigned to the event server 210. An "agent" may be a software entity having specific data, and may operable to receive a message (e.g. command), and return a result of the message. Each region of the plurality of regions of geographic space includes at least a portion of one area of the plurality of areas. In this embodiment, the region assigned to the event server 210 is the same as the region assigned to the mobile object server 220. However, in other embodiments, these regions may be different.

In the embodiment of FIG. 2, the region A, which is the region assigned to the event server 210, is divided into 16 areas and 16 areas are assigned to each of the event agents EA1-EA16. The event server 210 executes each of the event agents EA1-EA16 to manage events occurring on routes of each area of region A. For example, the event agent EA2 may manage a "closure" event on an area corresponding to EA2 on the map, and the event agent EA4 may manage a "speed limit" event on an area corresponding to EA4 as shown in FIG. 2.

The plurality of mobile object servers 220 may include at least one mobile object server 220 including one or more mobile object agents, each of which is assigned to each of the mobile objects 10. In the embodiment of FIG. 2, the mobile object server 220 includes three mobile object agents MOAs 1-3 assigned to three mobile objects 10 in the assigned region A. The mobile object server 220 executes each of the mobile object agents MOA1-MOA3 to manage the mobile objects 10 traveling on the region A.

Figure 3:
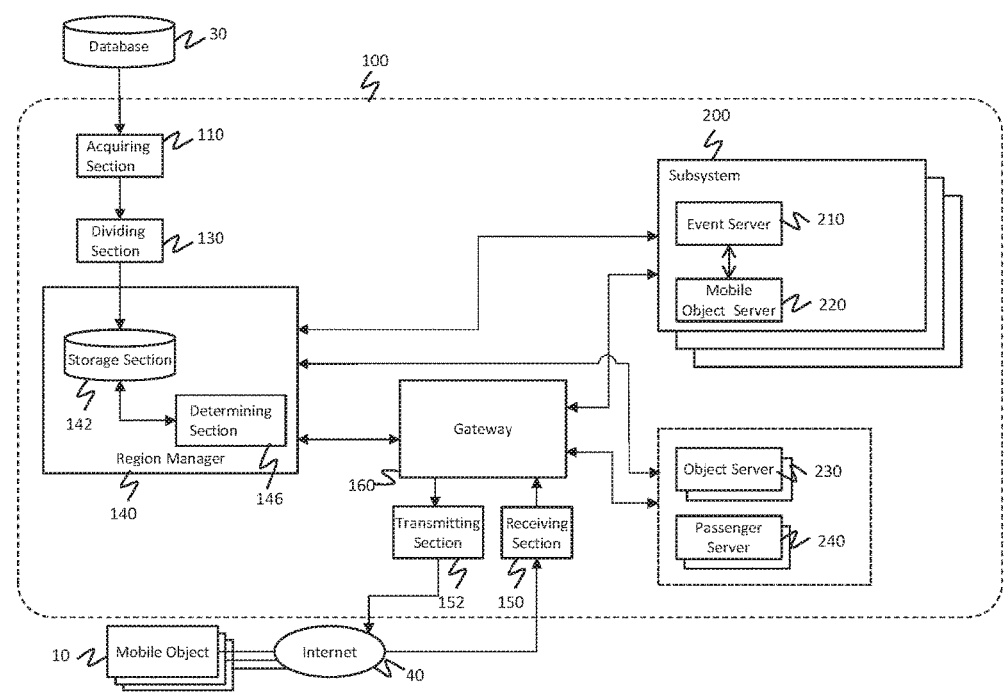
FIG. 3 shows a first exemplary configuration of the system 100 according to the present embodiment.

FIG. 3 shows an exemplary configuration of the system 100, according to an embodiment of the present invention. The system 100 may be operable to communicate with each of a plurality of mobile objects 10 to send and receive the information used to manage the mobile objects 10. The system 100 may be operable to acquire map data and/or information exchanged with the mobile objects 10, through the Internet, a subscriber network, a cellular network, or any desired combination of networks. The system 100 includes an acquiring section 110, a dividing section 130, a region manager 140, a receiving section 150, a transmitting section 152, a gateway apparatus 160, a plurality of subsystems 200, a plurality of object servers 230, and a plurality of passenger servers 240.

The acquiring section 110 may be operable to acquire map data corresponding to the geographical areas where a mobile object 10 is positioned, from an external database 30, for example. In response to the map being updated, the acquiring section 110 may acquire some or all of the updated map data. The acquiring section 110 may be operable to acquire the map data from the Internet, a subscriber network, a cellular network, or any desired combination of networks. The system 100 may be operable to store the map data in advance.

The acquiring section 110 may further acquire an event that has occurred within the geographic space to be managed by the system 100. In this case, the acquiring section 110 may acquire, accident information, traffic information, weather information, time information, etc.

The dividing section 130 may be operable to communicate with the acquiring section 110 and divide the map area into a plurality of regions. In this embodiment, the dividing section 130 generates two groups of regions by dividing an original map area into a plurality of regions.

The region manager 140 may be operable to store information concerning the plurality of regions including the regions resulting from the division. The region manager 140 may be operable to specify the subsystem 200 managing the region that includes the position of the mobile object 10, in response to receiving the position of the mobile object 10. The region manager 140 may be implemented on one or more servers. The region manager 140 includes a storage section 142 and a determining section 146.

The storage section 142 may be operable to communicate with the dividing section 130 and store information concerning the plurality of first regions and the plurality of second regions resulting from the division by the dividing section 130. The storage section 142 may store setting values or the like of the system 100.

The storage section 142 may store intermediate data, calculation results, threshold values, parameters, and the like that are generated by or used in the operations of the system 100. In response to a request from any component within the system 100, the storage section 142 may supply the data stored therein to the component making the request. The storage section 142 may be a computer readable storage medium such as an electric storage device, a magnetic storage device, an optical storage device, an electromagnetic storage device, or a semiconductor storage device.

The determining section 146 may be operable to communicate with the storage section 142, and determine one region from the plurality of regions (e.g., regions A-F of FIG. 1) in which each of the mobile objects 10 is located based on the position information of the mobile object 10 and geographic information of the plurality of regions. The determining section 146 may identify a route or position in the map area managed by the system 100 that corresponds to the position information of the mobile object 10.

The determining section 146 may store the position information of this mobile object 10 and/or information of the determined region in the storage section 142, in association with this mobile object 10. The determining section 146 may store a history of the position information of this mobile object 10 and/or a history of the determined mobile object server 220 in the storage section 142. The determining section 146 may be a circuit, a shared or dedicated computer readable medium storing computer readable program instructions executable by a shared or dedicated processor, etc.

The receiving section 150 may be operable to receive information transmitted from each of a plurality of mobile objects 10. Each mobile object 10 may transmit information at designated time intervals, and the receiving section 150 may sequentially receive this transmitted information. In this embodiment, the receiving section 150 may receive car probe data from each mobile object 10 as the information. The car probe data may include information detected by the mobile object 10, such as position information of the mobile object 10.

In one embodiment, the position information may include longitude and latitude (and optionally altitude information) of the mobile object 10 in an absolute coordinate system. In another embodiment, the mobile object 10 may determine its location in the absolute coordinate system by using GPS, and the determining section 146 receiving the position information may determine a route on which the mobile object 10 exists and a specific location of the route at which the mobile object 10 exists based on the position information. Alternatively, the mobile object 10 may include such detailed position information in the car probe data.

The receiving section 150 may communicate with the plurality of mobile objects 10 and receive the car probe data of each mobile object 10, via the Internet 40. The receiving section 150 may receive the car probe data of the plurality of mobile objects 10 through wireless communication, a subscriber network, a cellular network, or any desired combination of networks.

The transmitting section 152 may be operable to transmit event information to each of the mobile objects 10 according to settings, for example. The transmitting section 152 may transmit information concerning the route on which the mobile object 10 is expected to travel. The transmitting section 152 may communicate with the mobile objects 10 and transmit each type of information to the mobile objects 10 via the Internet 40. The transmitting section 152 may transmit each type of information to the mobile objects 10 through wireless communication, a subscriber network, a cellular network, or any desired combination of networks.

The gateway apparatus 160 may be operable to transfer communication between the plurality of subsystems 200 and the plurality of mobile objects 10. The gateway apparatus 160 may communicate with the receiving section 150 and receive the information transmitted by each mobile object 10.

The gateway apparatus 160 may communicate with the region manager 140 and demand the transfer destination for each piece of information received from the mobile objects 10, of the region manager 140. In response to this request, the gateway apparatus 160 may receive from the region manager 140 the information of the subsystem 200 managing the region on which the mobile object 10 exists. The gateway apparatus 160 may transfer the information received from the mobile object 10 to the subsystem 200 that is to manage the mobile object 10. In other words, the gateway apparatus 160 may transfer the information received from each mobile object 10 to the subsystem 200 determined by the region manager 140.

The gateway apparatus 160 may communicate with each of the subsystems 200, and receive the information transmitted by each subsystem 200. The gateway apparatus 160 may communicate with the transmitting section 152 and supply the transmitting section 152 with the information received from each subsystem 200, such that this information is transferred to the mobile objects 10 designated for each subsystem 200.

The gateway apparatus 160 may include a plurality of gateway devices, and may quickly perform transfer between the plurality of subsystems 200 and the plurality of mobile objects 10. In this case, the receiving section 150 may function as a load balancer that supplies the information from the mobile objects 10, such that the load is spread among the plurality of gateways. The load balancer may sequentially supply information from the mobile objects 10 to the gateways having lighter loads. The gateway apparatus 160 may be a network that provides a connection between a plurality of networks using the same or different types of protocols.

A plurality of subsystems 200 may be operable to communicate with the region manager 140 and the gateway apparatus 160 and to respectively manage a plurality of regions in a geographic space. Each subsystem 200 is operable to manage mobile objects 10 that travel routes in its managing region and to manage events on its managing region.

As described, each subsystem 200 may include the event server 210 and the mobile object server 220. The event server 210 manages events occurring on its managing region with the plurality of the event agents. In one embodiment, the event server 210 may perform, through the event agent, (i) registration, update and/or deletion of events, (ii) registration, update and/or deletion of candidate events, and (iii) provision of event information.

The mobile object server 220 manages the plurality of the mobile objects 10 traveling on its managing region with the plurality of the mobile object agents. In one embodiment, the mobile object server 220 may perform, through the mobile object agent, (i) processing of the car probe data, (ii) update of information of the mobile object, and (iii) provision of information to the mobile object. For example, the mobile object server 220 may execute the mobile object agent to collect information of events from at least one event server 210, and provide the mobile object 10 with information that assists the mobile object 10 with traveling in the geographic space.

A plurality of object servers 230 including at least one object server 230 may communicate with the gate way 160 and include an object agent (OA) containing information of the mobile object 10. An object agent may correspond to each mobile object 10 and contain information thereof. In one embodiment, the object agent may contain (i) information, by region, of which subsystem currently manages a mobile object agent of the mobile object 10, (ii) an identification (ID) of the mobile object 10, (iii) an ID of a passenger of the mobile object 10, and (iv) a characteristic of the mobile object 10 (e.g., model/version information, width, length, and/or height of the mobile object 10).

The object server 230 may perform, through the object agent, (i) provision and/or update of information of the mobile object 10, (ii) registration, update, and/or deletion of the ID of passenger riding on the mobile object 10, (iii) provision and/or update of the information of the region of the mobile object 10, and (iv) provision of information needed for generation of a new mobile object agent by the mobile object server 220.

At least one passenger server 240 of a plurality of passenger servers may communicate with the gateway 160, and include a passenger agent that contains information of at least one passenger. A passenger agent may correspond to each passenger or candidate passenger of mobile objects 10, and contain information thereof. In one embodiment, the object agent may contain an ID of a passenger and a characteristic of the passenger (e.g., information of age, gender, type, and the like of license of the passenger). The passenger server 240 may perform, through the passenger agent, provision and/or update of information of the passengers.

As described above, the system 100 of the present embodiment may manage the mobile objects by utilizing the mobile object agents in each mobile object server 220, and manage the events by utilizing the event agent in each event server 210. According to the system 100 of the embodiment, the system 100 can separately manage information relating to the mobile objects 10 and events on the geographic map with a plurality of kinds of servers. Furthermore, the plurality of mobile object servers 220 can smoothly transfer the management of the mobile objects 10 traveling across the regions via the mobile object agents, thereby improving the efficiency of the whole system 100. In addition, according to the system 100 of the embodiment, each event server 210 divides event management in one region among the plurality of event agents and provides the mobile object agent with event information, thereby improving the efficiency of event management in the region (e.g., improving response time of event search) and thus event notification to the mobile objects 10. In addition, the system 100 can provide the mobile object agent with information of mobile object 10 by the object agent of the object server 230. The system 100 can also provide the mobile object agent with information of passengers of the mobile objects 10 by the passenger agent of the passenger server 240.

Figure 4:
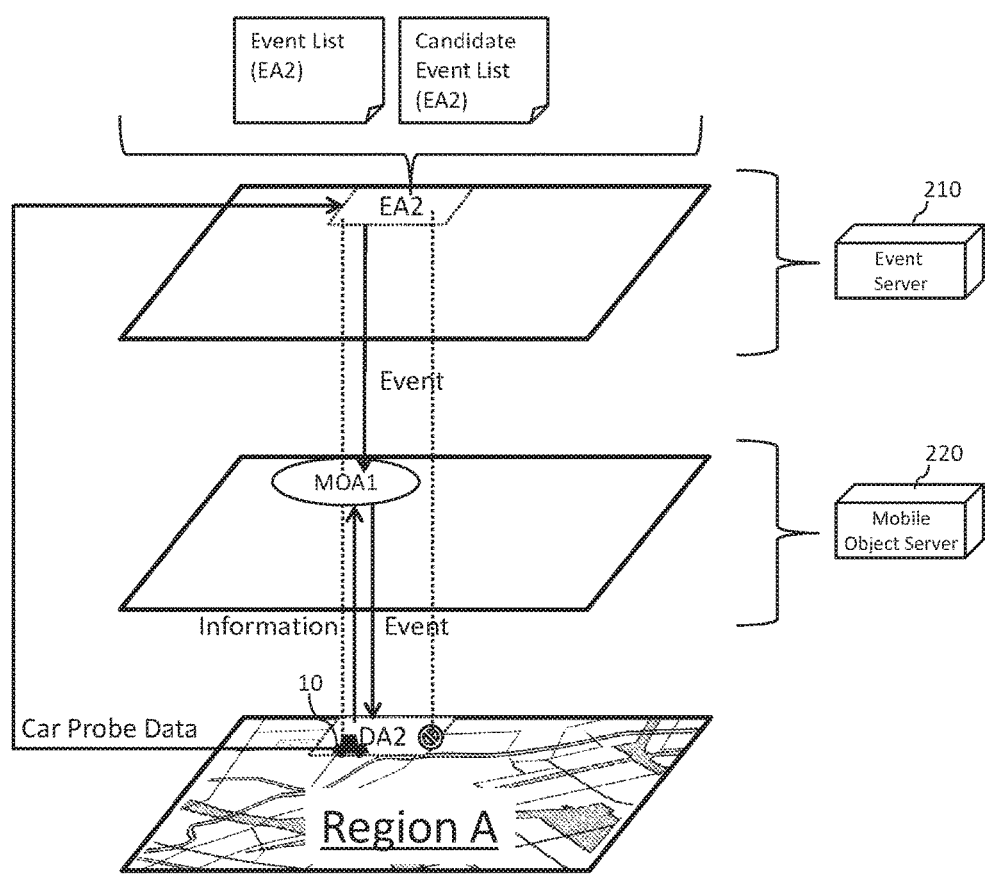
FIG. 4 shows management of events by the event server 210 and the mobile object server 220 according to one embodiment.

FIG. 4 shows management of events by the event server 210 and the mobile object server 220, according to an embodiment of the present invention. In this embodiment, a mobile object 10 is traveling on a target route on region A and transmitting a car probe data including the position information to the event server 210 managing region A with the car probe data via a gateway apparatus, such as the gateway apparatus 160. The event server 210 manages event information through each event agent based on the car probe data from the mobile objects on region A. For example, each event agent may manage an event list (containing information of an event and an influence event for routes on the area managed by the event agent) and a candidate event list (containing information of candidates of an event for routes on the area managed by the event agent).

In the embodiment of FIG. 4, the event agent EA2 manages events of an area (indicated as "DA2" on the region A of FIG. 4) by the event list of the event agent EA2 and the candidate event list of the event agent EA2 based on car probe data from the mobile object 10 on the area DA2. For example, the event agent EA2 assigned to the area DA2 is executable to generate an event based on the information from the mobile object 10.

In one embodiment, each mobile object server 220 is operable to receive information from the mobile object 10 in the region A assigned to the mobile object server 220. The mobile object server 220 determines the target route where the mobile object 10 is located. The mobile object server 220 sends the information to one event server 210 assigned to a region A where the mobile object 10 is located, and thereby requests the event agent EA2 assigned to the area DA2 where the target route is located to send an event list containing information of an event on the target route and the influence event of the target route.

The mobile object server 220 executes the mobile object agent MOA1 for the mobile object 10 to provide the mobile object 10 with information that assists the mobile object 10 with traveling in the area DA2 based on the information of the event on the other route and the influence event of the target route. In the embodiment of FIG. 4, the mobile object agent MOA1 receives, from the event agent EA2, the event information of the route on which the mobile object 10 exists, and provides the mobile object 10 with the event information (e.g., information of closure).

Figure 5:
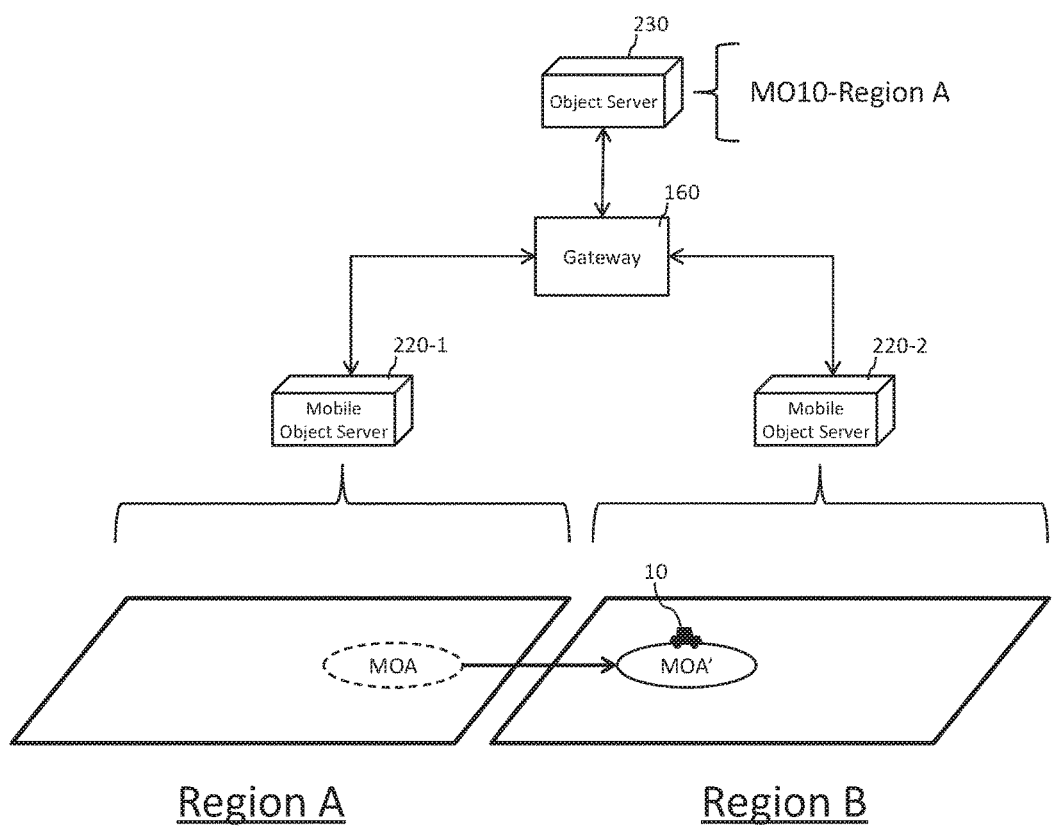
FIG. 5 shows management of mobile object by the mobile object server 220 and object server 230 according to one embodiment.

FIG. 5 shows management of a mobile object 10 by the mobile object servers 220 and object server 230, according to an embodiment of the present invention. The mobile object server 220-1 may transfer the mobile object agent via the gateway 160 to the mobile object server 220-2 assigned to a neighboring region in response to the mobile object 10 moving to the neighboring region. In this embodiment, in response to a mobile object 10 traveling from region A to region B, the mobile object server 220-1 managing region A deletes the mobile object agent MOA for the mobile object 10, and a mobile object server 220-2 managing region B generates a mobile object agent MOA for the mobile object 10.

In this embodiment, the object server 230 may store information that includes a mobile object server identifier MOS-ID that identifies one of the plurality of mobile object servers 220 executing the mobile object agent corresponding to the object agent 10. Just after the mobile object 10 arrives at region B, the mobile object server 220-2 has not been executing the mobile object agent for the mobile object 10. The mobile object server 220-2 is operable to receive information from the mobile object 10 in the region B assigned to the mobile object server 220-2.

Using the information from the mobile object 10, the mobile object server 220-2 obtains the mobile object server identifier MOS-ID from the object server 230 that manages the object agent for the mobile object 10 because the mobile object server 220-2 is not executing the mobile object agent for the mobile object 10. The mobile object server 220-2 requests a mobile object server 220-1 identified by the mobile object server identifier MOS-ID to transfer the mobile object agent for the mobile object 10. Then the mobile object server 220-1 managing region A transfers the mobile object agent to the mobile object server 220-2 assigned to a neighboring region B in response to the request.

Figure 6:
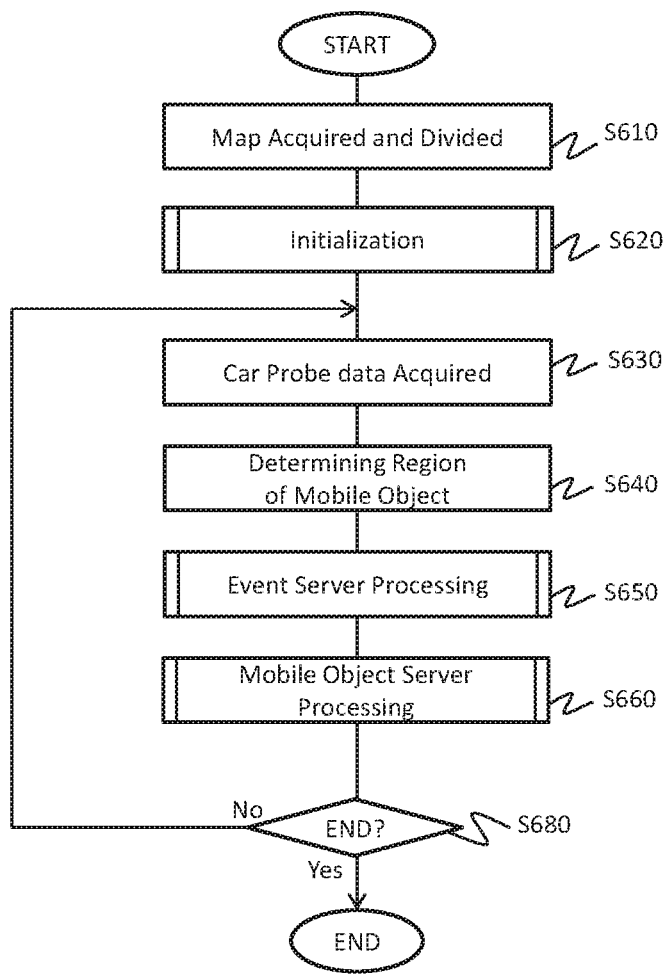
FIG. 6 shows an operational flow of an exemplary configuration of the system 100 according to the present embodiment.

FIG. 6 shows an operational flow of a system, according to an embodiment of the present invention. The present embodiment describes an example in which the system 100 performs the operations from S610 to S680 shown in FIG. 6 to manage mobile objects, such as mobile object 10, and events on a map area. FIG. 6 shows one example of the operational flow of the system 100 shown in FIGS. 1-5, but the system 100 shown in FIGS. 1-5 is not limited to using this operational flow explained below. Also, the operational flow in FIG. 6 may be performed by other systems.

First, an acquiring section, such as the acquiring section 110, may acquire the map data of the geographic space to be managed by the system (S610). The acquiring section may acquire map data of a geographic space that includes one or more cities, one or more towns, and the like. The acquiring section may include map data of a geographic space including one or more states, countries, continents, etc. A dividing section, such as the dividing section 130, may divide the map area to generate a plurality of regions.

Next, the system may perform an initialization process for the mobile object (S620). The system may perform the process of S620 if a user (passenger) initializes a setting of a mobile object and any passengers of the mobile object, before starting to drive the mobile object.

After S620, a gateway apparatus, such as the gateway apparatus 160, of the system may acquire a car probe data from the mobile object (S630). Although the system may acquire the car probe data from the plurality of the mobile objects, the system acquiring a car probe data from one mobile object (which, may be referred to as "a target mobile object") is explained in the below description. The car probe data may include information detected by the target mobile object, such as current position information of the target mobile object, a speed and/or direction of the target mobile object, and event information observed by the target mobile object (e.g., occurrence of ABS, detection of obstacles, or the like). In one embodiment, the position information may include an edge ID of an edge on which the target mobile object exists and the distance between the current location of the target mobile object and the one end of the edge.

Next, the gateway apparatus may determine a region on which the target mobile object is traveling based on the position information of the car probe data of the target mobile object (S640). In one embodiment, the gateway apparatus may inquire a region manager, such as the region manager 140, about the region on which the mobile object exists. A determining section, such as the determining section 146, of the region manager may determine the region the target mobile object and provide the gateway apparatus with the information of the region of the target mobile object. The gateway apparatus may provide an event server, such as the event server 210, that manages the determined region and a mobile object server, such as the mobile object server 220, that manages the determined region with the car probe data.

Next, the event server that is provided with the car probe data of the target mobile object may process events for the mobile objects (S650). The event server may manage event information based on the car probe data for notification of events to the target mobile object.

After S650, the mobile object server that is provided with the car probe data of the target mobile object may manage a mobile object agent for the target mobile object (S660).

After S660, the system determines whether to end the process for the target mobile object at S680. In one embodiment, the gateway apparatus may determine whether the car probe date indicates the engine stop of the target mobile object. If the system determines not to end the process, then the system proceeds with the process of S630 for the target mobile object. If the system determines to end the process, then the system ends the process for the target mobile object, and may continue the process for other mobile objects.

As described above, the system manages mobile objects by utilizing mobile object agents realized by the plurality of the mobile object servers. Since the system can transfer the mobile object agent between the mobile object servers, it can efficiently manage the mobile objects traveling around the plurality of regions. Furthermore, the system collects car probe data from the mobile objects and manages events generated from the car probe data by utilizing the event agents. Since each event server divides a number of events occurring on its managing regions into a plurality of areas by utilizing the event agents, it can efficiently handle event information.

The process of S610 may be performed once before starting processes S620-S680. The process of S620-S680 may be performed for every mobile object.

Figure 7:
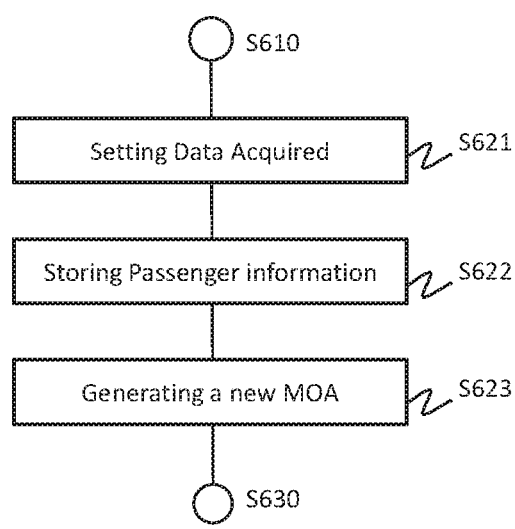
FIG. 7 shows an operational flow of S620 according to the present embodiment.

FIG. 7 shows an operational flow of an initialization process for a mobile object, according to an embodiment of the present invention. The present embodiment describes an example in which the system performs an initialization process, such as the initialization process of S620 of FIG. 6, through processes S621 to S623 shown in FIG. 7.

First, a gateway apparatus receives a setting data (including an ID of the mobile object, an ID(s) of passenger(s) and position information of the mobile object) from the mobile object (S621). The gateway apparatus determines one mobile object server that manages the mobile object based on the position information of the mobile object. The gateway apparatus provides the determined mobile object server with the setting data. Then, the determined mobile object server obtains information (e.g., ID(s) of the passenger(s)) of at least one passenger of the mobile object from the setting data of the mobile object.

Then, the mobile object server may request the object agent of the object server for the mobile object to store the information of the at least one passenger of the mobile object (S622). For example, each mobile object may be mapped to each object agent of the object servers based on values of the IDs of the mobile objects, and the mobile object server may identify one object agent corresponding to the ID of the mobile object based on the calculation using the ID. Then, the mobile object server may provide the object server managing the identified object agent with the setting data including the position information, the ID of the mobile object, and ID(s) of passenger(s) of the mobile object via the gateway apparatus.

Next, the object server stores the information of passenger(s) on an object agent. In one embodiment, each of passengers may be preliminarily mapped to each of the passenger servers based on values of the IDs of passengers, and the passenger servers may have information of passengers. The object server may identify one passenger server corresponding to the ID of a passenger based on the calculation using the ID. The object server may receive, via the gateway apparatus, the information of passengers from the passenger server corresponding to the ID. Then, the object server may store or update the information of the mobile object and the passengers of the mobile object, in the object agent for the mobile object. The object server may include the information of a region that the mobile object currently exists, in the object agent.

Next, the mobile object server 220 managing the region in which the mobile object 10 exists generates a new mobile object agent for the mobile object 10 (S623). In one embodiment, the mobile object server 220 may copy the information of the object agent for the mobile object 10 to the newly generated mobile object agent. For example, the mobile object server 220 may store the information of the mobile object 10 and the information of the at least one passenger of the mobile object 10 in the newly generated mobile object agent for the mobile object 10.

Figure 8:
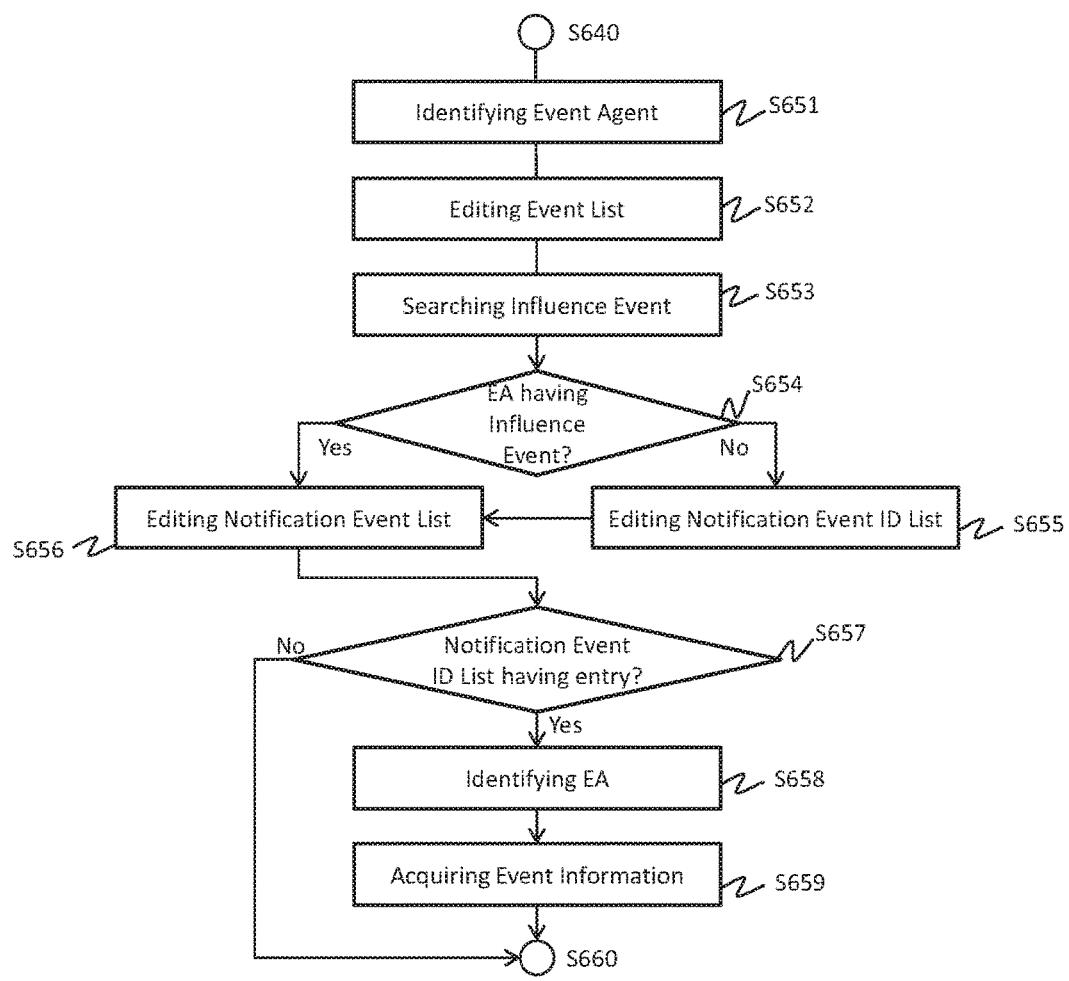
FIG. 8 shows an operational flow of S650 according to the present embodiment.

FIG. 8 shows an operational flow of event processing, according to an embodiment of the present invention. The present embodiment describes an example in which the system performs event processing, such as the event processing of S650 of FIG. 6, through processes S651 to S659 shown in FIG. 8.

First, the event server may identify an event agent (S651). In one embodiment, the event server determines one event agent from the plurality of event agents based on the position information of the target mobile object. The determined event agent may be referred to as "target event agent." For example, the event server determines a target route (or an edge of the map data) of the target mobile object based on the position information and the map data, and selects, as a target event agent, an event agent that manages an area including the target route of the target mobile object indicated by the car probe data. In another embodiment, the car probe data of a target mobile object may include the information of the target route of the target mobile object.

Next, the event server may edit event lists by the target event agent based on the car probe data (S652). In one embodiment, the target event agent may generate or update information of events (e.g., an edge that an event occurs, an event ID, a location of an event, and content of event) of the target route on the event list based on information of the car probe data. The event of the target route may be referred to as a "target event."

Next, the event server may search, by the target event agent, an influence event on the target route on the area of the target event agent based on the car probe data (S653). The influence event of the target route relates to an event on another route within a threshold distance (e.g., a threshold travelling distance of the target route, a threshold number of edges away from the target route, and/or a threshold travelling time from the target route).

In one embodiment, the target event agent itself may search routes (or edge IDs) apart from the target route within the threshold distance based on the topology information of routes in the regions, or may request other entities (e.g., a server) to search for routes (or edge IDs).

Next, the event server may determine whether the event list of the target event agent includes event entries corresponding to all influence events of the target route searched at S653 (S654). In one embodiment, the target event agent determines whether edges of the influence events are listed as edge IDs of events in the event list.

If an area managed by a target event agent includes the routes (edges) of all influence events relating to an event, then an event list of the target event agent includes corresponding event entries of all influence events. However, if the routes (edges) of any influence events are managed by other event agents, then the event list may not include corresponding event entries of all influence events. If the decision is positive, then the event server proceeds with the process S656 and if negative, the event server proceeds with the process S655.

At S655, the event server may edit a notification event ID list by the target event agent. The notification event ID list includes IDs of influence events and edge IDs of the influence events that are determined to be not included in the event list of the target event agent at S654. In other words, the notification event ID list is a list of event IDs of influence events that are not managed by the target event agent. Then, the event server may proceed with the process of S656.

At S656, the event server may edit a notification event list for the target mobile object, by the target event agent. The notification event list is a list of events that may be helpful to the target mobile object traveling on the target route. The notification event list may include target events and influence events of the target events. The target event agent may add entries of the target events and the influence events in its managing event list for notification.

Next, the event server determines, by the target event agent, whether the notification event ID list has at least one entry at S657. If the decision is positive, then the event server proceeds with the process of S658, and if negative, then the event server ends the process of S650.

At S658, the event server may identify, by the target event agent, an event agent that manages an event list including events in the notification event ID list. The determined event agent may be referred to as "remote event agent."

Next, the event server may acquire information of events in the notification event ID list (S659), and end the process S650. In one embodiment, the target event agent may receive information of events in the notification event ID list from the remote event agent, and edit the notification event list based on the acquired information. In another embodiment, the target event agent may add entries of the influence events in the notification event ID list based on the acquired information.

FIG. 9 shows an illustrative example of an event list, according to an embodiment of the present invention. As described in FIG. 9, the event list may include edge IDs of events, event IDs of events, locations of events, specific contents of events, and influence events relating to events. In this embodiment, each route is represented as "edge." For example, this event list indicates that an event (identified as "Eve 0214") has occurred along the full length of edge 0001 on the area, that the event has limited the speed to 30 km/h, and that edge 0001 includes an influence event identified as "Eve 0114." The event list also indicates that an event (identified as "Eve 0114" on edge 0002) has occurred 32 m from the 1st node on edge 0002 on the area, that the event is a closure of a route, and that "Eve 0114" includes influence events identified as "Eve 0214" on edge 0001, "Eve 0421" on edge 0003, etc. In one embodiment, the target event agent may add a new entry corresponding to an event detected by the car probe data, in the event list.

According to the first entry in the event list of FIG. 9, the edge 0001 has influence event 0114. This may mean that a mobile object traveling on the edge 0001 is influenced by the event 0114 that has occurred apart from edge 0001 within a threshold distance. In response to receiving the car probe data including the position information indicating that the target mobile object is traveling on the edge 0001, the target event agent searches and obtains routes (edge IDs) apart from the target route (edge 0001) within the threshold distance, and then finds neighboring edge 0002 as a result. In response to receiving the car probe data including the position information of the edge 0001, the target event agent determines whether the edge of influence event (edge 0002) corresponding to the target route is listed as edge IDs in the event list.

The target event agent assigned to the area may generate or update a candidate event based on information from the target mobile object. In one embodiment, the target event agent may generate or update candidate events on the candidate event list including information of a plurality of edges on the area of the event agent based on information of the car probe data.

Although the event list of FIG. 9 includes information of influence events, the information of the influence events may be managed by another list. In one embodiment, the event agent may manage both a first event list containing information of an event on the target route and a second event list containing information of the influence event.

FIG. 10 shows an illustrative example of a candidate event list, according to an embodiment of the present invention. As described in FIG. 10, the event list may include edge IDs of candidate events, counts of detecting candidate events, locations of candidate events, and specific contents of candidate events for each candidate event. For example, this candidate event list indicates that evidence of an event (congestion) has been observed twice along the full length of edge 0009 on the area, and that evidence of an event (skid) has been observed once at a point 15 m from the 2nd node on edge 0013 on the area.

The target event agent may determine whether to change a candidate event in the candidate event list to an event in the event list. In one embodiment, the target event agent may upgrade the candidate event to the event based on information from other mobile objects. In this case, the target event agent counts occurrences of a candidate event observed by a plurality of mobile objects (including the target mobile object and other mobile objects). If the count of a candidate event exceeds a threshold value, then the target event agent determines that the candidate event is upgraded to an event. In one embodiment, in response to the upgrade, the target event agent deletes the entry of the candidate event from the candidate event list, and generates a new entry of an event corresponding to the deleted candidate event. The event servers may set the same or different criteria for upgrading candidate events among the plurality of event agents.

FIG. 11 shows an illustrative example of a notification event list, according to an embodiment of the present invention. As described in FIG. 11, the notification event list may include edge IDs of target/influence events, event IDs of target/influence events, locations of target/influence events, and specific contents of target/influence events. For example, this notification event list indicates that an event (speed limit) has occurred along the full length of edge 0001 on the area, and that an event (closure) has occurred at a point 32 m from the 1st node on edge 0002 on the area.

Figure 12:
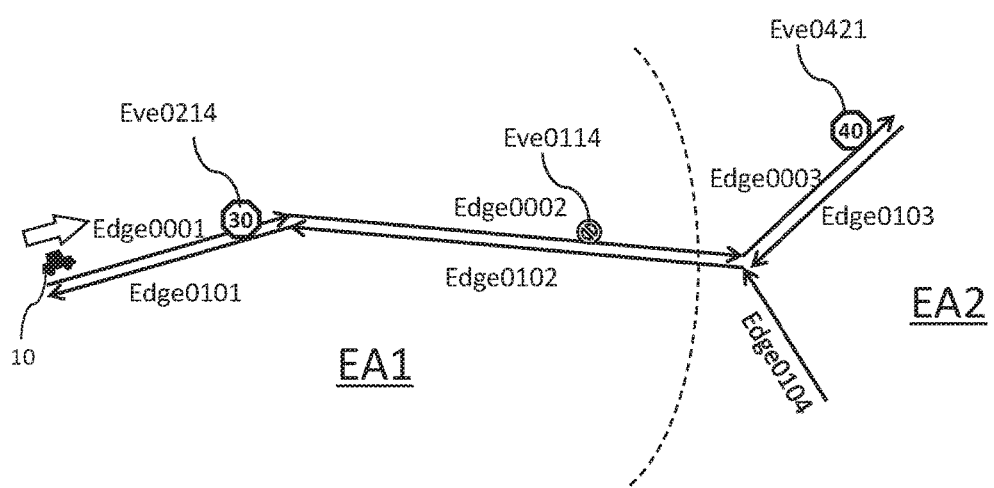
FIG. 12 shows a mobile object 10 and events according to one embodiment.

FIG. 12 shows a mobile object and events, according to an embodiment of the present invention. In the embodiment of FIG. 12, the target mobile object 10 is traveling eastbound on the edge 0001, which is the target route. The target event agent EA1 manages an area including the edge 0001, the edge 0002, the edge 0101, and the edge 0102, and the neighboring event agent EA2 manages an area including the edge 0003, the edge 0103, and the edge 0104.

Direction dependent edges are described in FIG. 12. However, edges may not be direction dependent according other embodiments, and in such embodiments, the event agent may manage events, candidate events, and influence events with direction information. The target event agent EA1 manages an event (Eve 0214) on the edge 0001 as the target event in the event list. Since the edge 0002 is apart from the edge 0001 within the threshold distance, the target event agent EA1 also manages an event (Eve 0114) on the edge 0002 as an influence event in the event list. The target event agent EA1 manages a notification event list including the target event (Eve 0214) and the influence event (Eve 0114) for the target mobile object 10.

In the embodiment of FIG. 12, the mobile object agent managing target mobile object requests the event agent EA1 that manages the target event (e.g., Eve 0214) and the influence event (e.g., Eve 0114) to send the notification event list including the target event and the influence event. In another embodiment, the mobile object agent may request the remote event agent EA2 that manages the information of influence event(s) (e.g., Eve 0421) to send a notification event list containing information of the influence event(s) if the influence event is located outside of the area including the target route (Edge 0001).

Figure 13:
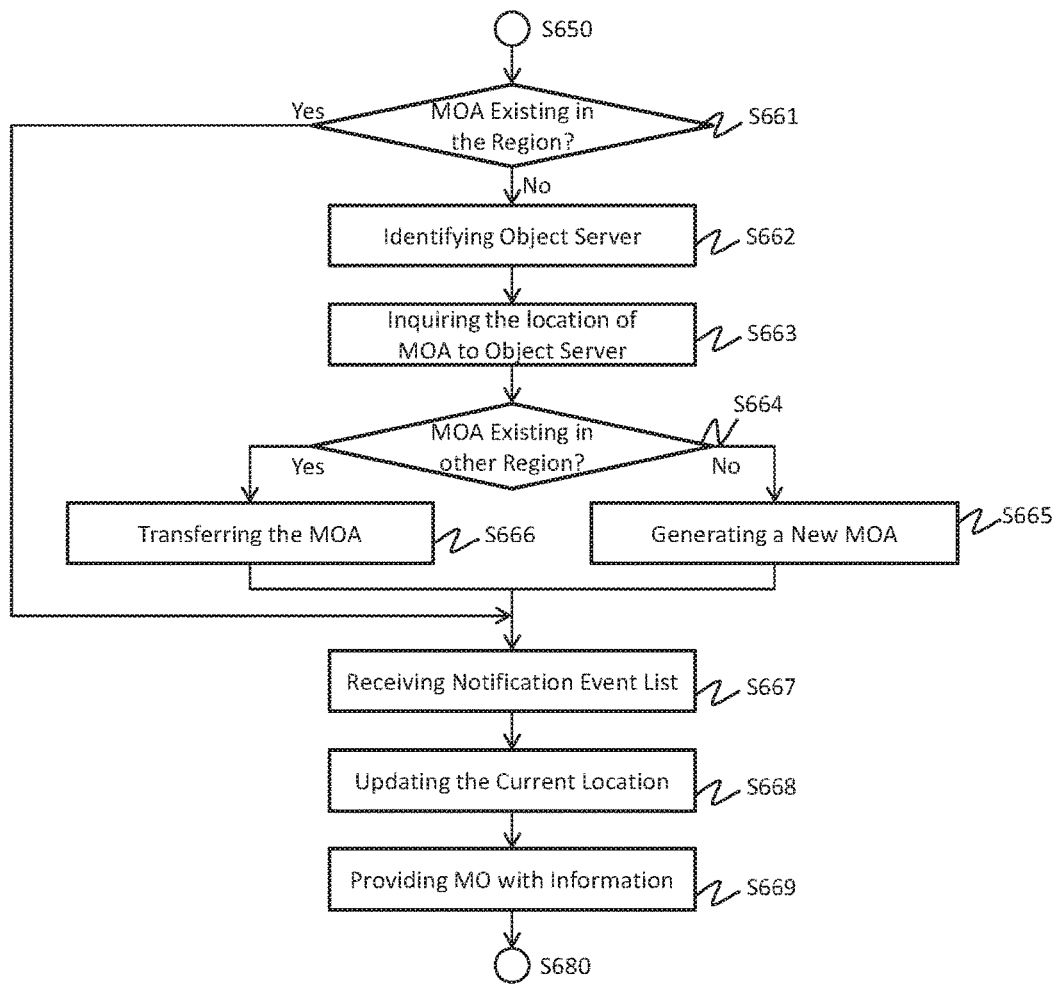
FIG. 13 shows an operational flow of S660 according to the present embodiment.

FIG. 13 shows an operational flow of mobile object processing, according to an embodiment of the present invention. The present embodiment describes an example in which the system manages the target mobile object, such as in S660 of FIG. 6, through processes S661 to S669 shown in FIG. 13.

At S661, the mobile object server may determine whether the mobile object agent for the target mobile object exists in the region determined to be the region of the mobile object, such as the region determined at S640. In other words, the mobile object server determines whether the mobile object server manages the mobile object agent of the target mobile object. If the decision is positive, then the mobile object server proceeds with the process S667, and if negative, the mobile object server proceeds with the process S662.

At S662, the mobile object server may identify an object server that includes the object agent containing the information of the target mobile object. In one embodiment, the mobile object server may identify the object server in the same manner described in S622.

Next, at S663, the mobile object server may inquire the object server 230 identified at S662 for the location of the mobile object agent of the target mobile object. The object server may refer to the object agent of the target mobile object, obtain information of the mobile object server that currently manages the mobile object agent MOA of the target mobile object, if it exists, and provide the mobile object server with the information.

Next, the mobile object server may determine whether the mobile object agent for the target mobile object exists in any other regions. In other words, the mobile object server may determine which mobile object server manages the mobile object agent for the target mobile object from the plurality of mobile object servers managing other regions, at S664. If the decision is positive, then the mobile object server proceeds with the process S666, and if negative the mobile object server proceeds with the process S665.

At S665, the mobile object server generates a new mobile object agent MOA for the target mobile object. The mobile object server may generate the mobile object agent MOA for the target mobile object by obtaining information of the target mobile object from the object server that includes the object agent containing the information of the target mobile object. In one embodiment, the mobile object server may generate the new mobile object agent in the same manner described in S623. The mobile object server may also communicate with the object server via the gateway apparatus, and register the current region of the target mobile object in the object agent corresponding to the target mobile object. By generating the new mobile object agent, the system can handle a new mobile object 10 that has been not managed by the mobile object server.

At S666, the mobile object server may transfer the mobile object agent from the other mobile object server determined to manage the mobile object agent for the target mobile object at S664. In one embodiment, the mobile object server may receive information of the mobile object agent for the target mobile object from the other mobile object server, and generate a new mobile object agent including the received information. The mobile object server may also communicate with the object server via the gateway apparatus, and register the current region of the target mobile object in the object agent of the target mobile object.

Next, at S667, the mobile object server may receive a notification event list for the target mobile object. In one embodiment, the mobile object server first determines the target route where the target mobile object is located. Then, the mobile object server may request the event agent that manages the information of target event(s) and influence event(s) corresponding to the target route to send a notification event list containing information of the target event(s) and influence event(s) of the target route.

At S668, the mobile object server may update the current location of the target mobile object by the mobile object agent. In one embodiment, the mobile object agent for the target mobile object updates the current location of the target mobile object based on the position information of the car probe data.

At S669, the mobile object server may execute the mobile object agent for the target mobile object to provide the target mobile object with information that assists the target mobile object with traveling in the geographic space based on the information included in the event list. In one embodiment, the mobile object agent may provide the target mobile object with information of events on the notification event list.

In one embodiment, the at least one mobile object server may execute the mobile object agent for the target mobile object to provide the target mobile object with information that assists the target mobile object with traveling in the geographic space based on the information of the at least one passenger of the target mobile object. For example, the mobile object agent may provide the target mobile object with an alert, a notice, and/or an action list relating events on the notification event list depending on a number of passengers (e.g., for guiding a car pool lane), the age, gender, license, real time information (e.g., driving history or sleep history), and characteristics of the passengers.

The action list is a list of actions recommended to passengers in response to the events (e.g., braking, accelerating, and/or steering of the target mobile object).

The action list may include commands to the target mobile object for automatic driving and/or driving assist. In one embodiment, the mobile object agent may include information that the passenger is sensitive to rough driving, and then the mobile object agent may provide commands to gently drive the target mobile object. In one embodiment, the mobile object agent may include information of driving skill of a driver passenger, and then provide different commands depending on the skill of the driver. The mobile object server may provide the target mobile object with the information via the gateway apparatus.

As described above, the mobile object server receives information from the target mobile object in the region assigned to the mobile object server, and generates the mobile object agent for the target mobile object if there is no mobile object server among the plurality of mobile object servers that is executing the mobile object agent.

Figure 14:
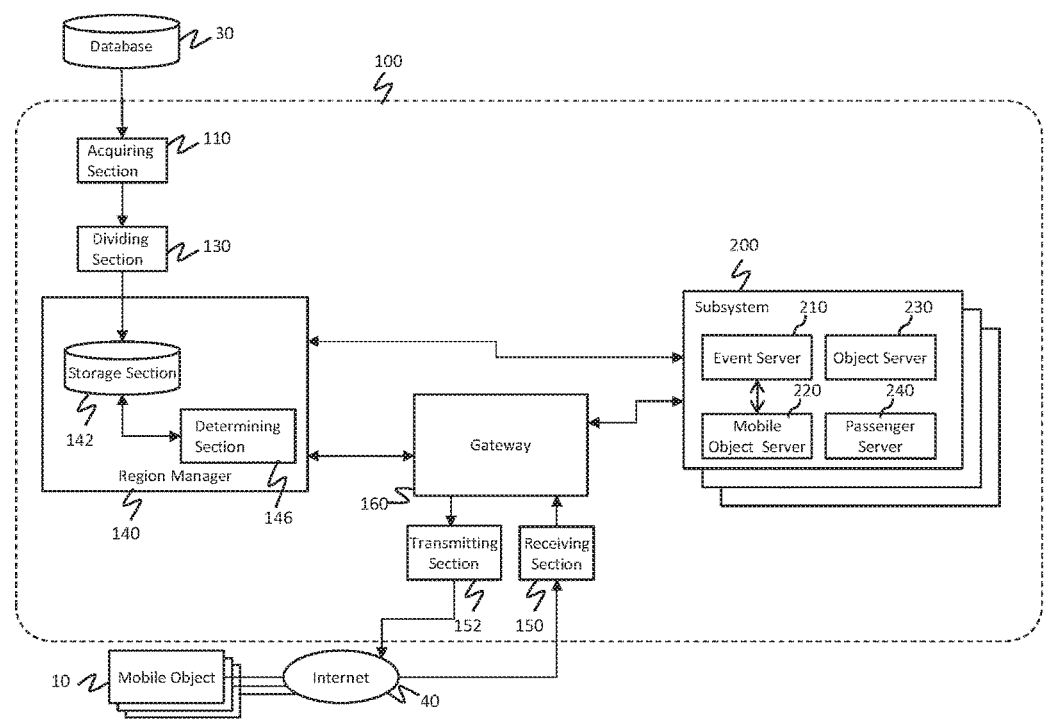
FIG. 14 shows a second exemplary configuration of the system 100 according to the present embodiment.

FIG. 14 shows an exemplary configuration of the system 100, according to an embodiment of the present invention. In the system 100 according to the present embodiment, components that have substantially the same operation as components of the system 100 according to the present embodiment shown in FIG. 3 are given the same reference numerals, and descriptions thereof are omitted. In this embodiment, each subsystem 200 includes an event server 210, mobile object server 220, an object server 230, and a passenger server 240. However, other embodiments are also possible, in which each subsystem 200 comprises any combination of singles or multiples of each server. In other embodiments, the system 100 may manage allocation of object agents of the object server 230 and passenger agents of the passenger server 240 in the subsystem 200. For example, the gateway apparatus 160 may change allocation of the object/passenger agents to the subsystems 200 to rectify the imbalance of data processing loads among the subsystems 200.

In the embodiment described above, the event server 210 may manage allocated event agents. In other embodiments, the system 100 may manage allocation of event agents to the event servers 210. For example, the gateway apparatus 160 may change allocation of event agents to the event servers 210 to rectify the imbalance of loads of processing events among the event servers 210. In the embodiment described above, the event server 210 causes each event agent to manage allocated divided area derived from a region. In other embodiment, the event server 210 causes at least one event agent to manage specific information regarding events (e.g., cross section of roads or other specific function(s) of a map, or, hurricane or other disaster/accident).

In the manner described, the system 100 according to the present embodiment may be operable to assist with the movement of a plurality of mobile objects 10 in the geographical space. Here, there are cases where the information received by the receiving section 150 includes falsified information, information including a virus or the like, information adding an attack on the system 100, and the like. The hardware and software installed in mobile objects 10 is often primitive, and can include hardware or software with specification that have been made public to a certain standard.

Accordingly, it can be easy to change or alter such hardware and software. Furthermore, there are cases where viruses, malware, or the like are installed in the hardware or software that is installed in the mobile objects 10, and transmission of falsified data attacks on the system 100, or the like can occur regardless of the will of the user. It can be difficult for the system 100 to handle information received from such a mobile object 10 as information with low reliability. For example, the system 100 can detect abnormalities based on similarity to past statistical information, known attack patterns, or the like, but in the case of an unknown attack, falsified data that resembles actual data, or the like, this detection becomes difficult.

Therefore, the system 100 according to the present embodiment may be operable to judge the reliability of information received from a mobile object 10 while assisting the mobile objects 10, and to prevent a drop in the stability and reliability of the system 100. The following describes such a system 100.

Figure 15:
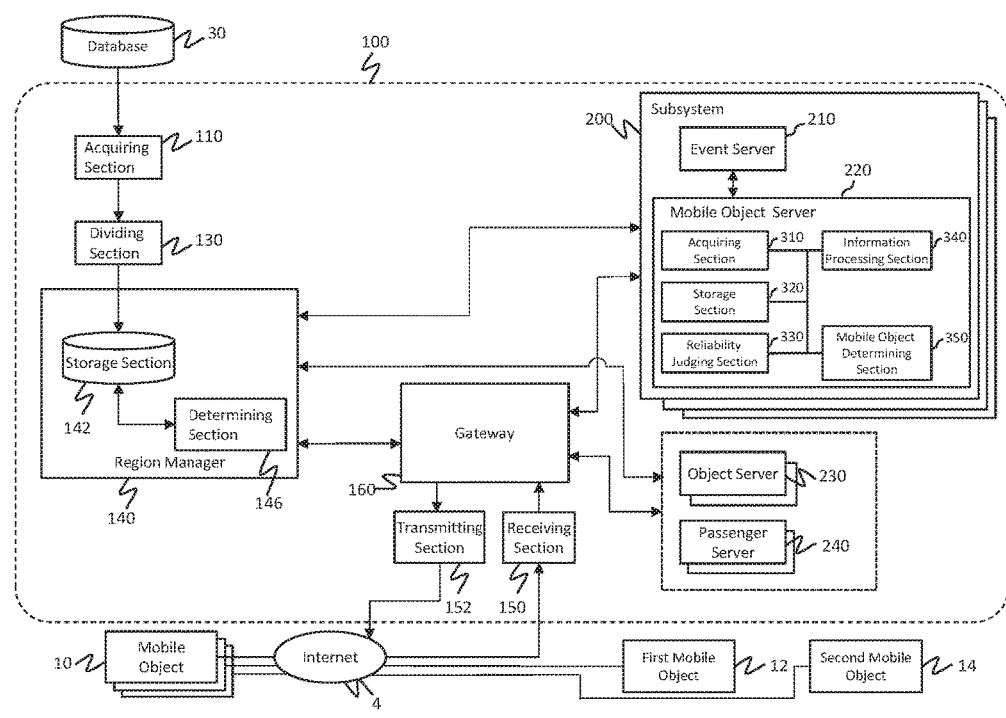
FIG. 15 shows a third exemplary configuration of the system 100 according to the present embodiment.

FIG. 15 shows a third exemplary configuration of the system 100 according to the present embodiment. In the system 100 according to the present embodiment, components having substantially the same operation as components in the system 100 according to the embodiment shown in FIG. 3 and FIG. 14 are given the same reference numerals, and descriptions thereof are omitted. The system 100 of the third exemplary configuration may be operable to receive verification results obtained by verifying each mobile object 10 from among a plurality of mobile objects 10, and to judge the reliability of the mobile object 10. The system 100 of the third exemplary configuration includes mobile objects 10, a first mobile object 12, and a second mobile object 14.

Each mobile object 10 may transmit a verification result to the system 100 every time the mobile object 10 is started up, at predetermined intervals, and every time a certain distance is travelled. Furthermore, each mobile object 10 may transmit a verification result to the system 100 in response to instructions from the system 100. The verification results transmitted by the mobile objects 10 are described further below. The subsystem 200 according to the present embodiment may be operable to receive each verification result from the plurality of mobile objects 10 while managing the mobile objects 10 in the geographical space to be managed, and to judge the reliability of these mobile objects 10.

In the present embodiment, a mobile object 10 that is the target for the reliability judgment by the subsystem 200 is set as a first mobile object 12. The mobile object server 220 of the subsystem 200 further includes an acquiring section 310, a storage section 320, a reliability judging section 330, an information processing section 340, and a mobile object determining section 350.

The acquiring section 310 may be operable to acquire a verification result received from the first mobile object 12. The acquiring section 310 may be operable to acquire information relating to the first mobile object 12 that transmitted the verification result. For example, the acquiring section 310 acquires information relating to the first mobile object 12 from a mobile object 10 that is different from the first mobile object 12 that transmitted the verification result. Furthermore, the acquiring section 310 may acquire information relating to the first mobile object 12 that transmitted the verification result from a monitoring apparatus or the like provided on a route on which the first mobile object 12 moves. In this case, the system 100 may be operable to communicate with the monitoring apparatus. This monitoring apparatus may be a camera or the like that monitors road conditions, traffic information, or the like.

The storage section 320 may be operable to store information acquired by the acquiring section 310. For example, the storage section 320 stores a history of the verification results of the first mobile object 12. The storage section 320 may store a history of information relating to the first mobile object 12. The storage section 320 may store map data managed by the subsystem 200. The storage section 320 may store the history of the verification results and/or the information relating to the first mobile object 12 in association with a position in this map data.

The storage section 320 may store each of intermediate data, calculation results, parameters, or the like that are generated by or used in the processes by which the subsystem 200 manages the plurality of mobile objects 10 including a plurality of the first mobile objects 12. In response to a request from each component in the system 100, the storage section 320 may supply the source of the request with the stored data.

The reliability judging section 330 may be operable to judge the reliability of the first mobile object 12 based on the verification results of the first mobile object 12. The reliability judging section 330 may judge the reliability of data received from the first mobile object 12 based on the verification result history of the first mobile object 12. The reliability judging section 330 may judge the reliability of the data received from the first mobile object 12 by comparing the verification result of the first mobile object 12 to the information relating to the first mobile object 12.

The information processing section 340 may be operable to perform information processing for each of the plurality of mobile objects 10. The information processing section 340 may perform information processing for a plurality of mobile objects 10, according to the reliability of the first mobile object 12. For example, in response to a judgment that the reliability of the first mobile object 12 is low, the information processing section 340 performs information processing for a plurality of mobile objects 10 while excluding the existence of this first mobile object 12. The information processing section 340 may be operable to perform information processing relating to the mobile object agent corresponding to each of a plurality of mobile objects 10.

The information processing section 340 may be operable to assist a plurality of mobile objects 10. The information processing section 340 may assist a plurality of mobile objects 10 while excluding the first mobile object 12, if the first mobile object 12 is not a real object or is an object that transmits data to attack the system. In other words, the information processing section 340 may assist a plurality of mobile objects 10 while excluding the first mobile object 12 without needing to transmit notifications and/or instructions corresponding to the information of the first mobile object 12.

The mobile object determining section 350 may be operable to determine a mobile object for which the reliability judgment is to be made. The mobile object determining section 350 may be operable to issue instructions for the output of a verification result to the determined mobile object. For example, the mobile object determining section 350 determines a first mobile object 12 as the mobile object for which the reliability judgment is to be made, from among a plurality of mobile objects 10, and instructs this first mobile object 12 to output a verification result. The mobile object determining section 350 may determine a mobile object for which the reliability judgment result is low or unknown, from among a plurality of mobile objects for which the reliability judgment has been made, to be a mobile object for which the reliability is to be judged.

In the manner described above, the system 100 of the third exemplary configuration judges the reliability of information received from the first mobile object 12 based on the verification result of the first mobile object 12. In other words, the first mobile object 12 according to the present embodiment may be operable to transmit the verification result to the corresponding mobile object agent among the plurality of mobile object agents executed by the information processing section 340. The following describes such a first mobile object 12 and a subsystem 200 that manages this first mobile object 12.

Figure 16:
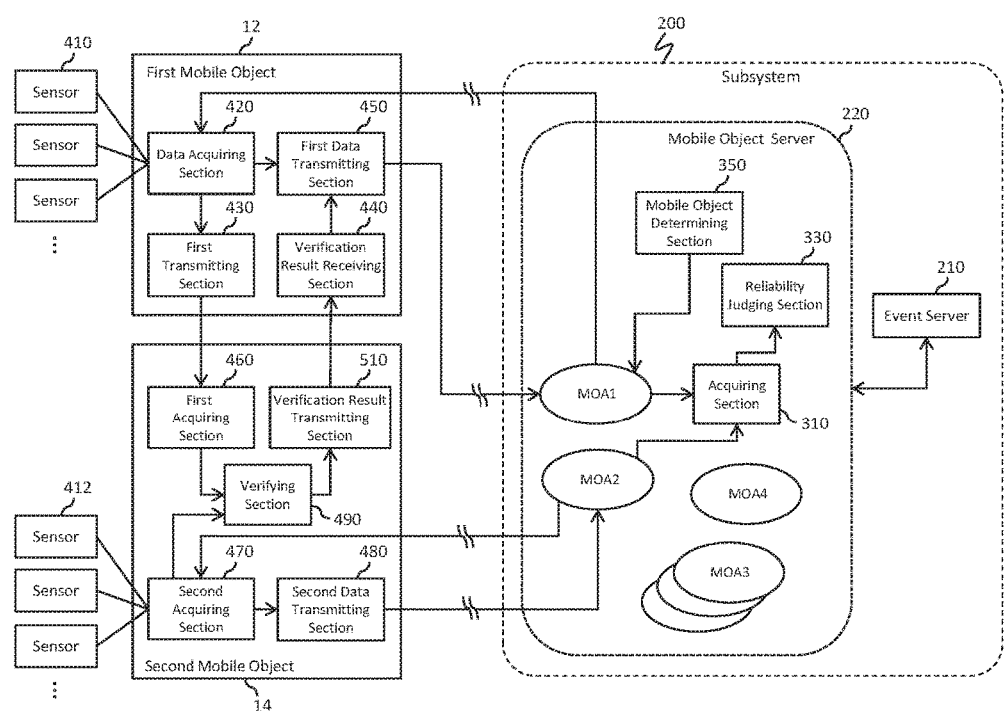
FIG. 16 shows a schematic exemplary configuration relating to the data transmitting and receiving of the system 100 of the third exemplary configuration according to the present embodiment.

FIG. 16 shows a schematic exemplary configuration relating to the data transmitting and receiving of the system 100 of the third exemplary configuration according to the present embodiment. FIG. 16 shows an example in which the schematics of the data transmission and reception between the subsystem 200, the first mobile object 12, and a second mobile object 14 are shown. The system 100 of the third exemplary configuration may include at least some first mobile objects 12 and second mobile objects 14.

The subsystem 200 may have substantially the same configuration as the subsystem 200 described in FIG. 15. FIG. 16 shows an example of a mobile object agent that is executed by the information processing section 340. FIG. 16 shows an example in which a mobile object agent MOA1 corresponds to the first mobile object 12 and a mobile object agent MOA2 corresponds to the second mobile object 14. In other words, the subsystem 200 includes a mobile object server 220 that is capable of assisting with the movement of a plurality of mobile objects 10 including a first mobile object 12 and a second mobile object 14.

The first mobile object 12 is an example of a mobile object that is a target for the reliability judgment by the subsystem 200. The first mobile object 12 is a mobile object for which the subsystem 200 makes a reliability judgment, from among the plurality of mobile objects 10. In other words, each mobile object 10 may be operable to act as the first mobile object 12. The first mobile object 12 includes a sensor 410, a data acquiring section 420, a first transmitting section 430, a verification result receiving section 440, and a first data transmitting section 450.

The sensor 410 may be operable to measure a state or the like of the first mobile object 12. A plurality of the sensors 410 may be provided in the first mobile object 12. The sensor 410 may detect the speed, position, remaining amount of fuel, remaining battery life, engine temperature, external temperature, or the like of the first mobile object 12. The sensor 410 may detect another mobile object using an image, laser, microwave, or the like.

The data acquiring section 420 may be operable to acquire measurement data of the sensor 410. The data acquiring section 420 may be operable to acquire information transmitted from the subsystem 200. In other words, the data acquiring section 420 may acquire transmission data from the corresponding mobile object agent MOA1. The data acquiring section 420 may acquire output instructions for the verification result transmitted from the mobile object determining section 350. In response to output instructions for a verification result, the data acquiring section 420 may transmit a request for verification of this first mobile object 12 and the acquired measurement data from the first transmitting section 430 to another mobile object.

The first transmitting section 430 may be operable to transmit the measurement data and the request for verification of the first mobile object 12 to the second mobile object 14. The first transmitting section 430 may transmit the measurement data and the request with a mobile object adjacent to the first mobile object 12, from among a plurality of mobile objects 10, serving as the second mobile object 14. Furthermore, if a transmission destination is included in the verification result output request, the first transmitting section 430 may transmit the measurement data and the request with this transmission destination as the second mobile object 14.

The verification result receiving section 440 receives the verification result of the second mobile object 14. If the verification result cannot be received from the second mobile object 14, the verification result receiving section 440 may set a result of communication being impossible as the verification result.

The first data transmitting section 450 may be operable to transmit the verification result received from the verification result receiving section 440 to the mobile object server 220. The first data transmitting section 450 may be operable to transmit measurement data of the sensor 410 acquired by the data acquiring section 420 to the mobile object server 220. In this case, for example, the mobile object agent MOA1 communicates with the data acquiring section 420 and the first data transmitting section 450 of the first mobile object 12, and assists with the movement of the first mobile object 12. In the manner described above, in response to verification result output instructions from the subsystem 200, the first mobile object 12 may make a request for verification of this first mobile object 12 to the second mobile object 14 and respond to this subsystem 200 with the verification result from the second mobile object 14.

The second mobile object 14 may be operable to verify the measurement data received from the first mobile object 12, in response to a request from the first mobile object 12. The second mobile object 14 includes a sensor 412, a first acquiring section 460, a second acquiring section 470, a second data transmitting section 480, a verifying section 490, and a verification result transmitting section 510.

The sensor 412 may be substantially the same sensor as the sensor 410 provided in the first mobile object 12. In other words, the sensor 412 may be operable to measure a state or the like of the second mobile object 14. The sensor 412 may detect another mobile object or the like. The second mobile object 14 may detect the first mobile object 12, if the second mobile object 14 is near this first mobile object 12. In this case, the second mobile object 14 may measure the position, speed, and the like of the first mobile object 12.

The first acquiring section 460 may be operable to receive measurement data transmitted from the first transmitting section 430 and a request for verification of the first mobile object 12. In other words, the first acquiring section 460 may be operable to acquire measurement data obtained by the first mobile object 12 measuring the first mobile object 12, using the sensor 410 of the first mobile object 12.

The second acquiring section 470 may be operable to acquire the measurement data of the sensor 412. The second acquiring section 470 may acquire the detection data obtained by the sensor 412 detecting the first mobile object 12, in response to a verification request of the first mobile object 12 received from the first mobile object 12. In other words, the second acquiring section 470 may be operable to acquire detection data obtained by the second mobile object 14 detecting the first mobile object 12 in response to a request from the outside, using the sensor of the second mobile object 14. If there is no verification request from the first mobile object 12, the second acquiring section 470 may perform an operation that is substantially the same as that of the data acquiring section 420 provided in the first mobile object 12.

The second data transmitting section 480 may be operable to transmit the detection data acquired by the second acquiring section 470 to the mobile object server 220. The second data transmitting section 480 may be operable to transmit the state or the like of the second mobile object 14 acquired by the second acquiring section 470 to the mobile object server 220. In this case, for example, the mobile object agent MOA2 communicates with the second acquiring section 470 and the second data transmitting section 480 of the second mobile object 14 and assists with the movement of the second mobile object 14.

The verifying section 490 may be operable to verify the validity of the measurement data using the detection data of the first mobile object 12. The verifying section 490 may be operable to verify the validity of the measurement data using the detection data acquired by the second acquiring section 470, in response to the first acquiring section 460 acquiring the measurement data and the verification request of the first mobile object 12. The verifying section 490 may generate the verification result by comparing measurement results of measurement items that are substantially the same in the measurement data and the detection data. The verifying section 490 may generate the verification result by referencing the measurement result according to the first mobile object 12 and the measurement result according to the second mobile object 14.

The verification result transmitting section 510 may be operable to transmit the verification result of the verifying section 490 to the first mobile object 12 that transmitted the verification request. The verification result transmitting section 510 may be operable to include a signature of the second mobile object 14 in the verification result and send this to the first mobile object 12. The signature of the second mobile object 14 may be a code or the like set between the second mobile object 14 and the system 100 of the third exemplary configuration. In the manner described above, in response to a verification request from the first mobile object 12, the second mobile object 14 may perform verification by measuring the second mobile object 14 and respond to this second mobile object 14 with the verification result.

The system 100 of the third exemplary configuration described above verifies the measurement result according to the first mobile object 12 by using an object measurement result according to the second mobile object 14, and can therefore easily judge the reliability of the data output by the first mobile object 12. The following describes the operation of such a system 100 of the third exemplary configuration.

Figure 17:
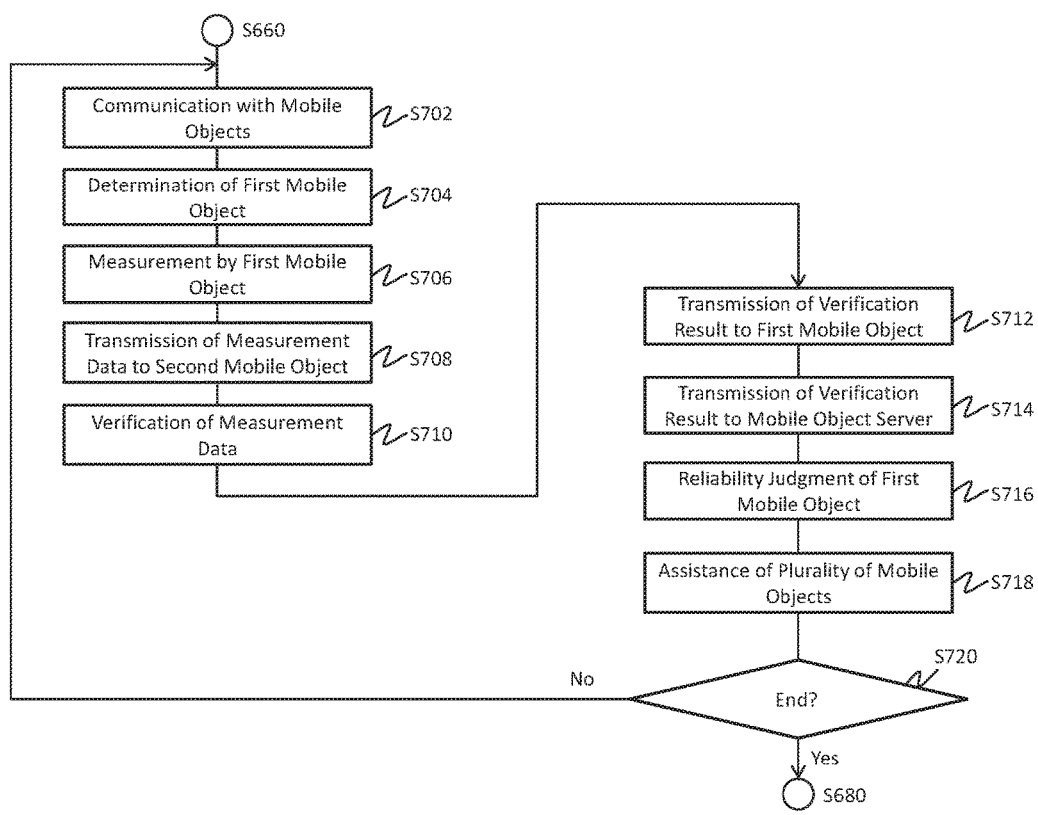
FIG. 17 shows a portion of an operational flow of the system 100 according to the present embodiment.

FIG. 17 shows a portion of an operational flow of the system 100 according to the present embodiment. The mobile object server 220 according to the present embodiment may be operable to judge the reliability of data received from each mobile object 10 while assisting the plurality of mobile objects 10 in the geographical space, by performing the operational flow shown in FIG. 17. In other words, the operational flow shown in FIG. 17 may be performed by the mobile object server 220 in addition to or instead of the moving object server processing (S660) of the mobile object server described in FIG. 6 and FIG. 13.

First, at S702, the system 100 may communicate with the plurality of mobile objects 10 moving in the geographical space. For example, the system 100 may acquire one or more pieces of sensor information, from among sensor information detected by sensors mounted respectively in the plurality of mobile objects 10. In other words, the mobile object agent may acquire sensor information from corresponding mobile objects 10. Furthermore, in response to the power source or engine of a mobile object 10 beginning operation (i.e. starting up), the corresponding mobile object agent may begin communication. For example, in response to the startup of the first mobile object 12, the mobile object agent MOA1 corresponding to the first mobile object 12 begins communicating with the first mobile object 12.

Next, at S704, the mobile object determining section 350 may determine the mobile object for which the reliability judgment is to be made. For example, in response to the first mobile object 12 starting up, the mobile object determining section 350 may determine that this first mobile object 12 is the mobile object for which the reliability judgment is to be made. Furthermore, the mobile object determining section 350 may determine that a mobile object whose reliability was low in past judgment results is the mobile object for which the reliability judgment is to be made. The mobile object determining section 350 may determine that a mobile object whose reliability was questionable in past judgment results is the mobile object for which the reliability judgment is to be made. The mobile object determining section 350 may instruct the first mobile object 12 to output a verification result. The mobile object determining section 350 may issue the instructions for the output of the verification result via the mobile object agent MOA1.

Here, the mobile object determining section 350 may determine a second mobile object 14 to verify the measurement data of the first mobile object 12, among the plurality of mobile objects 10. The mobile object determining section 350 may set a mobile object having higher reliability, among the mobile objects travelling near the first mobile object 12, to be the second mobile object 14. The mobile object determining section 350 may set an automobile that patrols a road with the objective of judging reliability, and therefore is already clearly reliable, to be the second mobile object 14. If the second mobile object 14 has been determined, the mobile object determining section 350 may supply the first mobile object 12 with verification result output instructions along with the information of this second mobile object 14.

Next, at S706, the first mobile object 12 may measure its own position information, speed, direction of progression, or the like, in response to the instructions of the mobile object determining section 350. Then, at S708, the first mobile object 12 may be operable to transmit the measurement data and the verification request of the first mobile object 12 to the second mobile object 14, in response to these instructions. If the information of the second mobile object 14 has been received from the mobile object determining section 350, the first mobile object 12 may transmit the measurement data and the verification request of the first mobile object 12 to this second mobile object 14. If the information of the second mobile object 14 has not been received, the first mobile object 12 may transmit the measurement data and the verification request of the first mobile object 12 while using a mobile object travelling nearby as the second mobile object 14.

Next, at S710, the second mobile object 14 may verify the measurement data of the first mobile object 12, in response to the verification request. The second mobile object 14 may acquire the detection data obtained by detecting the first mobile object 12, for example. The second mobile object 14 may verify the measurement data by comparing the detection data to the measurement data acquired from the first mobile object 12.

Next, at S712, the second mobile object 14 may transmit the verification result to the first mobile object 12. The second mobile object 14 may transmit the verification result including the signature of the second mobile object 14 to the first mobile object 12. Furthermore, the second mobile object 14 may transmit the detection data to the mobile object server 220. For example, the second mobile object 14 transmits the detection data to the mobile object agent MOA2.

Next, at S714, the first mobile object 12 transmits the verification result received from the second mobile object 14 to the mobile object server 220. The first mobile object 12 transmits the detection data to the mobile object agent MOA1, for example.

Next, at S716, the reliability judging section 330 may judge the reliability of the first mobile object 12 based on the verification result obtained by verifying the measurement data of the first mobile object 12. The reliability judging section 330 may judge the reliability of the first mobile object 12 by comparing the verification result received from the first mobile object 12 and the detection data received from the second mobile object 14. Furthermore, the reliability judging section 330 may judge the reliability of the first mobile object 12 according to the verification result of the first mobile object 12.

Next, at S718, the system 100 may assist the plurality of mobile objects 10 according to the judgment result of the reliability of the first mobile object 12. If the reliability of the first mobile object 12 is greater than or equal to a predetermined first reliability, the system 100 may transmit data to and receive data from the first mobile object 12 in the same manner as the other mobile objects 10.

If the reliability of the first mobile object 12 is less than a predetermined second reliability, the system 100 may limit the sending and receiving of the data to and from the first mobile object 12 to be within a predetermined range. Furthermore, the system 100 may register the first mobile object 12 as an automobile requiring caution, and monitor the data sending and receiving. The system 100 may instruct another mobile object 10 to limit communication with the first mobile object 12. The system 100 does not need to transfer the data received from the first mobile object 12 to other mobile objects 10.

If the reliability of the first mobile object 12 is greater than or equal to the predetermined second reliability and less than the first reliability, the system 100 may register the first mobile object 12 as an automobile that is questionable and monitor the sending and receiving of data. The system 100 may issue instructions for verification results a plurality of times for automobiles that require caution and automobiles that are questionable. In this case, the reliability judging section 330 may be operable to judge the reliability of the first mobile object 12 based on the plurality of verification results obtained by verifying the measurement data of the first mobile object 12.

Next, at S720, if the reliability judgments of the mobile objects are to continue (S720: No), the system 100 may return to S702 and judge the reliability of a mobile object. If there are no more mobile objects for which the reliability judgment is to be made or if the next process is to be prioritized (S720: Yes), the system 100 may end the reliability evaluation.

The system 100 of the third exemplary configuration described above may be operable to judge the reliability of data received from the first mobile object 12, according to whether a verification result of the first mobile object 12, which is its own verification result output to itself, contradicts the detection data of the second mobile object 14. In this way, the system 100 can objectively evaluate the data received from the first mobile object 12. Furthermore, the system 100 can prevent the transmission of falsified data against the will of the user operating the first mobile object 12, the occurrence of attacks on the system, or the like. In other words, the system 100 can prevent the operation from becoming unstable and prevent a drop in the reliability of the operation, which would be caused by such attacks or the like.

Figure 18:
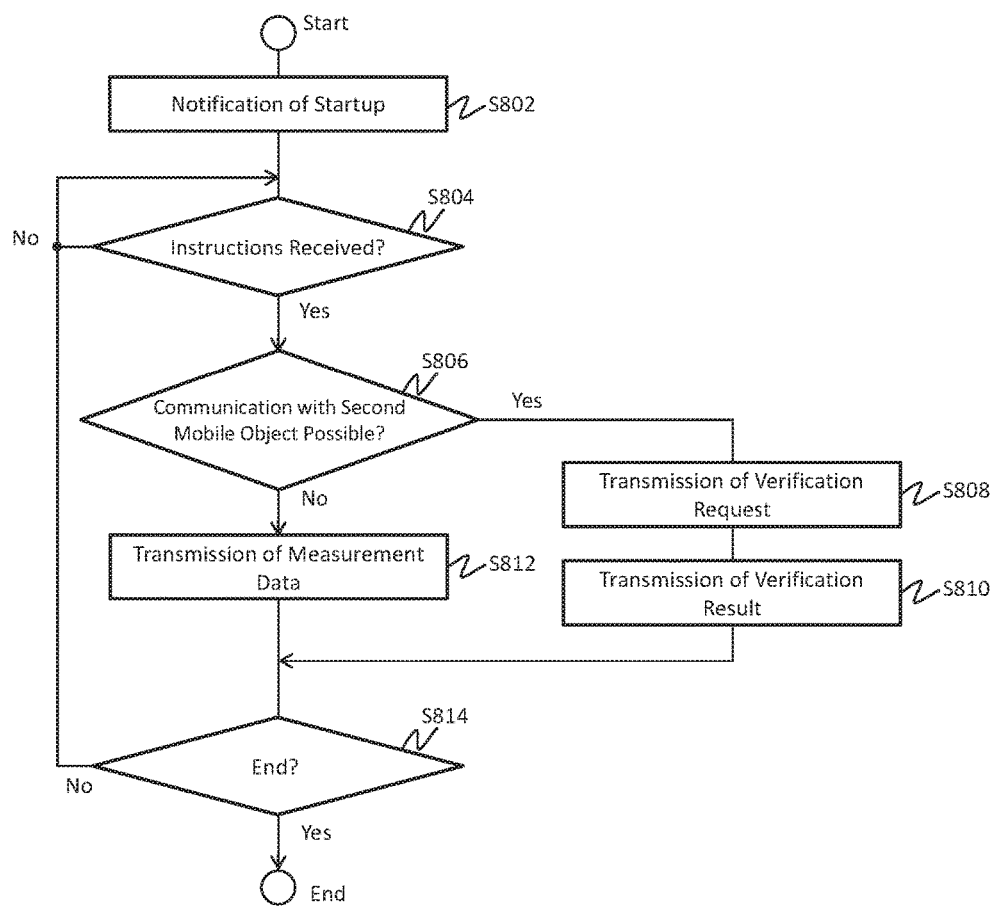
FIG. 18 shows an exemplary operational flow of the first mobile object 12 according to the present embodiment.

FIG. 18 shows an exemplary operational flow of the first mobile object 12 according to the present embodiment. The system 100 of the third exemplary configuration may be operable to verify the validity of the data transmitted by the first mobile object 12, by having the first mobile object 12 perform the operational flow shown in FIG. 18.

First, at S802, in response to the power source being turned ON and/or the engine starting up, the first mobile object 12 may notify the system 100 about this startup. For example, the first mobile object 12 notifies the corresponding mobile object agent MOA1 about this startup.

Next, at S804, the first mobile object 12 may wait for the verification result output instructions. If the wait for the verification result output instructions is continuing (S804: No), the first mobile object 12 may move while being assisted by the system 100. If the verification result output instructions are received (S804: Yes), the first mobile object 12 may attempt to communicate with the second mobile object 14 at S806.

If information of the second mobile object 14 is included in the verification result output instructions, the first mobile object 12 may attempt to communicate with this second mobile object 14. If information of the second mobile object 14 is not included in the verification result output instructions, the first mobile object 12 may attempt communication using a mobile object travelling nearby as the second mobile object 14.

If communication with the second mobile object 14 is achieved (S806: Yes), at S808, the first mobile object 12 may transmit the measurement data and the verification request of the first mobile object 12 to the second mobile object 14. Next, at S810, the first mobile object 12 may transmit the measurement data and the verification result received from the second mobile object 14 to the system 100. For example, the first mobile object 12 may transmit the measurement data and the verification result to the mobile object agent MOA1.

If communication with the second mobile object 14 cannot be achieved (S806: No), at S812, the first mobile object 12 may transmit the measurement data to the system 100. For example, the first mobile object 12 may transmit the measurement data to the mobile object agent MOA1.

If the first mobile object 12 continues travelling (S814: No), the process returns to S804 and the first mobile object 12 may wait for the next verification result output instructions. If the wait for the verification result output instructions continues, the first mobile object 12 may move while being assisted by the system 100. If the travelling is stopped (S814: Yes), the first mobile object 12 may end the communication with the system 100. The first mobile object 12 may end the travelling while waiting for the output instructions.

Figure 19:
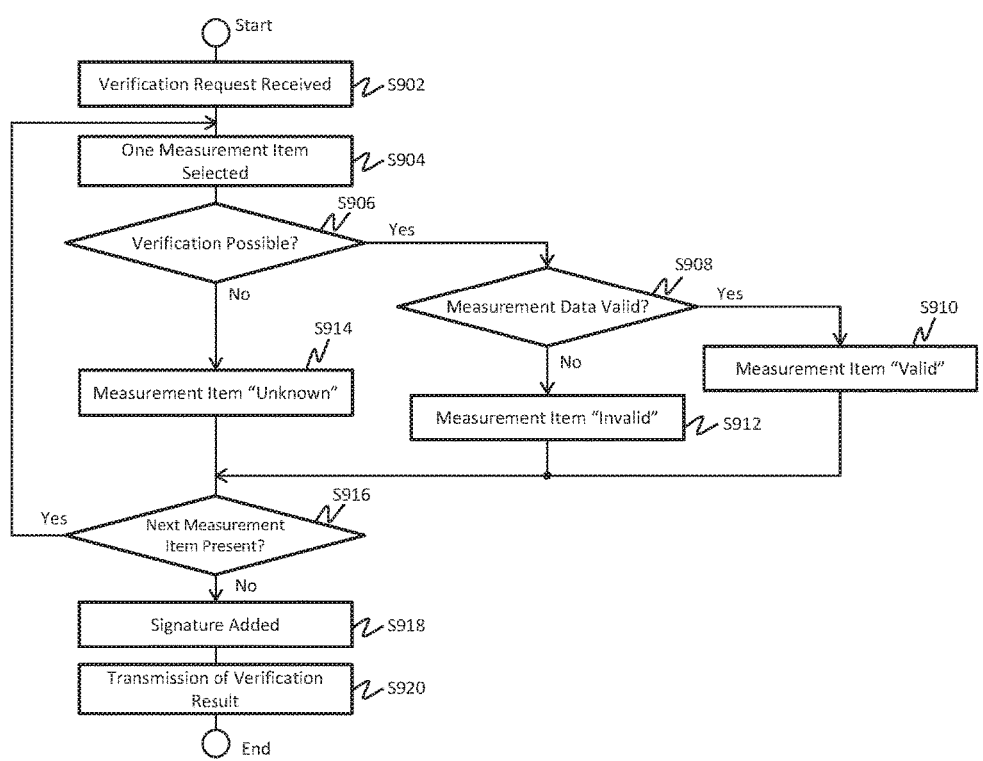
FIG. 19 shows an exemplary operational flow of the second mobile object 14 according to the present embodiment.

FIG. 19 shows an exemplary operational flow of the second mobile object 14 according to the present embodiment. The second mobile object 14 may verify the validity of the measurement data of the first mobile object 12 by performing the operational flow shown in FIG. 19.

First, at S902, the second mobile object 14 may receive the measurement data and the verification request of the first mobile object 12 from the first mobile object 12. Next, at S904, the second mobile object 14 may select one measurement item within the measurement data. The second mobile object 14 may be operable to, if the selected measurement item can be detected by this second mobile object 14 (S906: Yes), verify the measurement item. For example, the second mobile object 14 is operable to verify the speed, position, movement direction, and the like of the first mobile object 12. In this case, at S906, the second mobile object 14 detects this measurement item of the first mobile object 12.

Next, at S908, if the measurement data and the detection data match within a predetermined range (S908: Yes), the second mobile object 14 may set the measurement data as a valid value. In this case, at S910, the second mobile object 14 may set the verification result of this measurement item to be "Valid." If the measurement data and the detection data do not match within a predetermined range (S908: No), the second mobile object 14 may set this measurement data to be an invalid value. In this case, at S912, the second mobile object 14 may set the verification result of this measurement item to be "Invalid."

The second mobile object 14 may be operable to, if the selected measurement item cannot be detected by this second mobile object 14 (S906: No), set this measurement item to be unverifiable. For example, the second mobile object 14 may set the remaining amount of fuel, remaining battery life, temperature, or the like of the first mobile object 12 to be unverifiable. In this case, at S914, the second mobile object 14 may set this measurement item to be "Unknown."

The second mobile object 14 may return to S904 and repeat the verification operation (S916: Yes) until there are no more measurement items in the measurement data. If there are no more measurement items in the measurement data (S916: No), at S918, the second mobile object 14 may add its signature to the verification result. Next, at S920, the second mobile object 14 may respond to the first mobile object 12 with the verification result. Furthermore, the second mobile object 14 may transmit the detection data used in the verification to the system 100. For example, the second mobile object 14 may transmit the detection data to the mobile object agent MOA2.

Figure 20:
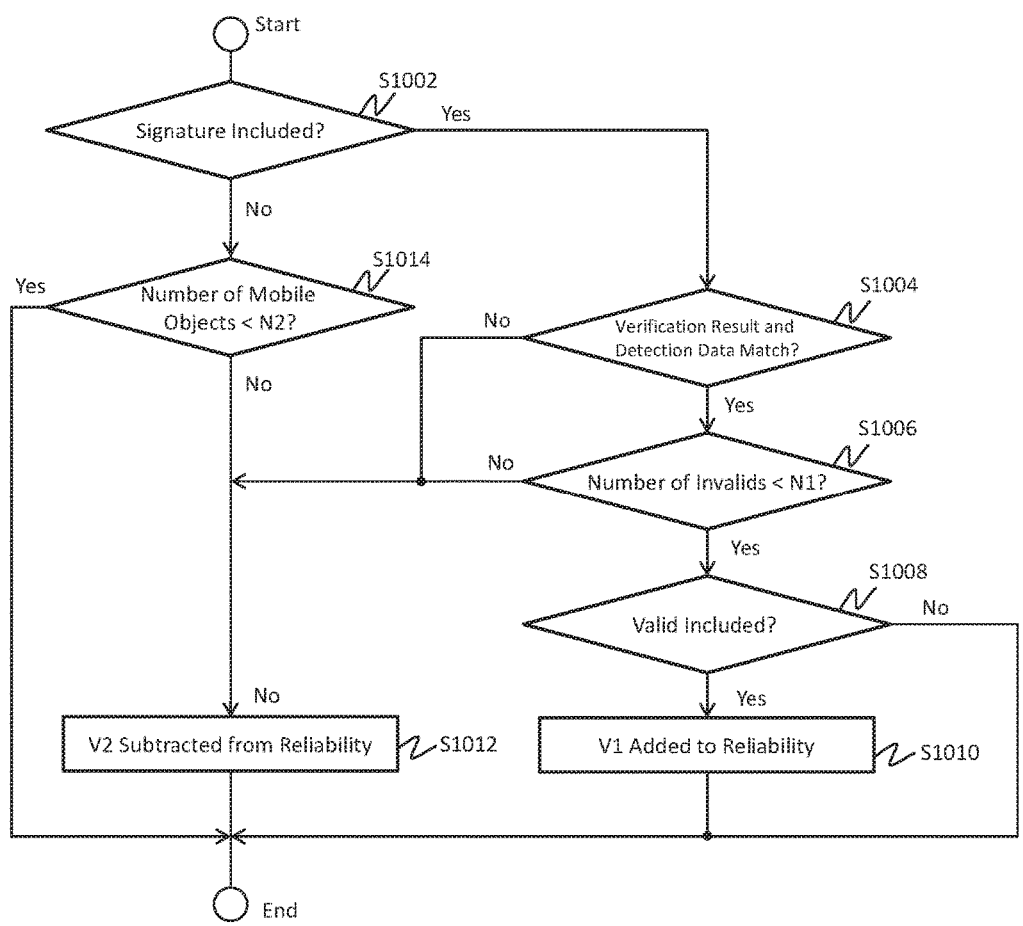
FIG. 20 shows an exemplary operational flow of the reliability judging section 330 according to the present embodiment.

FIG. 20 shows an exemplary operational flow of the reliability judging section 330 according to the present embodiment. The reliability judging section 330 may judge the reliability of data received from the first mobile object 12, by performing the operational flow shown in FIG. 20. In other words, the operational flow shown in FIG. 20 is an example of a detailed operational flow of the operation of S716 described in FIG. 17.

First, at S1002, the reliability judging section 330 may check whether the signature is included in the verification result received from the first mobile object 12. If the signature is included in the verification result (S1002: Yes), at S1004, the reliability judging section 330 may check whether the verification result and the detection data received from the second mobile object 14 contradict each other. If all of the verification results and pieces of detection data match (S1004: Yes), at S1006, the reliability judging section 330 may check the number of "Invalid" instances included in the measurement items of the verification results.

If the number of "Invalid" instances is less than a predetermined number N1 (S1006: Yes), at S1008, the reliability judging section 330 may check whether a "Valid" instance is included in the measurement items of the verification result. If a "Valid" instance is included in the verification result (S1008: Yes), at S1010, the reliability judging section 330 may add a prescribed value V1 to the reliability and end the judgment. Here, the prescribed value V1 may be a predetermined numerical value. If a "Valid" instance is not included in the verification result (S1008: No), the reliability judging section 330 may end the process without changing the reliability value.

If the number of "Invalid" instances is greater than or equal to the predetermined number N1 (S1006: No), at S1012, the reliability judging section 330 may subtract a prescribed value V2 from the reliability and end the judgment. Here, the prescribed value V2 may be a predetermined numerical value. The absolute values of the value V1 added to the reliability and the value V2 subtracted from the reliability may be the same or may be different. If there is a contradiction between the verification result and the detection data (S1004: No), at S1012, the reliability judging section 330 may subtract a prescribed value from the reliability and end the judgment.

If the signature is not included in the verification result (S1002: No), at S1014, the reliability judging section 330 may check the traffic state on the road where the first mobile object 12 is travelling. If the number of other mobile objects passing by on the road where the first mobile object 12 is travelling is less than a predetermined number N2 (S1014: Yes), the reliability judging section 330 may end the judgment without changing the reliability value.

If the number of other mobile objects passing by on the road where the first mobile object 12 is travelling is greater than or equal to the predetermined number N2 (S1014: No), at S1012, the reliability judging section 330 may subtract a prescribed value from the reliability and end the judgment. In the manner described above, the reliability judging section 330 may perform an update by adding to or subtracting from the reliability based on the verification result and the detection data. By sequentially performing the reliability judgment for each of the plurality of mobile objects 10, the system 100 of the third exemplary configuration can judge whether the received data from each mobile object 10 can be trusted.

The system 100 of the third exemplary configuration described above is an example in which the second mobile object 14 verifies the measurement data of the first mobile object 12 and transmits the verification result of the first mobile object 12, but it is not limited to this. For example, the mobile object server 220 may verify the measurement data of the first mobile object 12. The following describes such a system 100.

Figure 21:
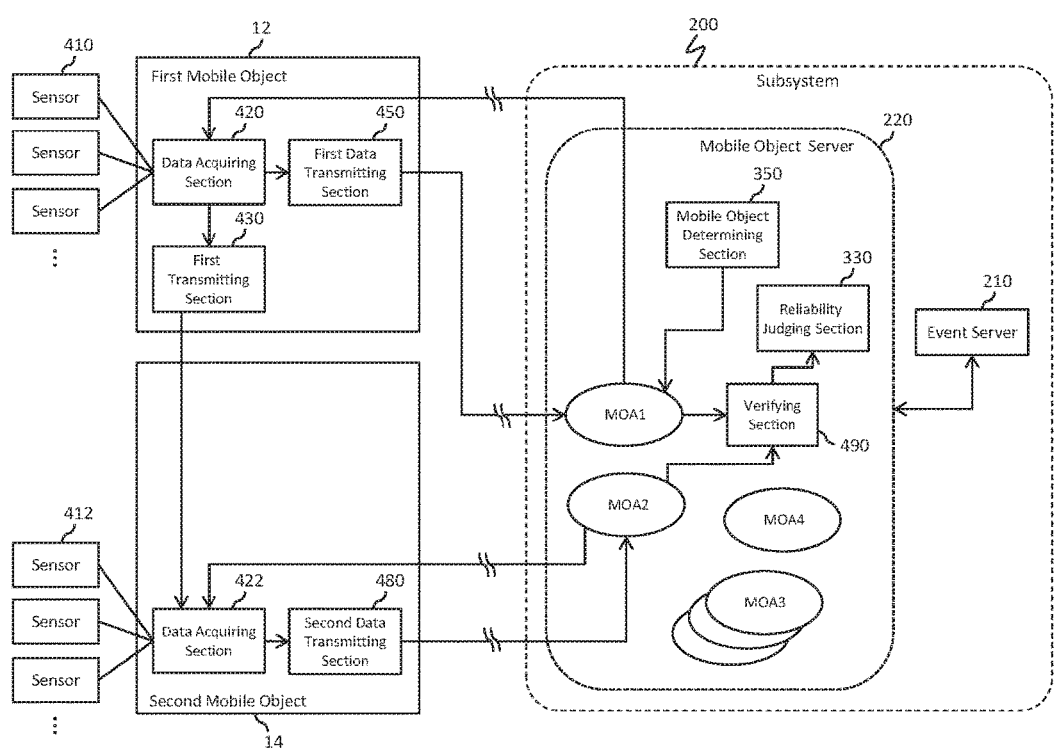
FIG. 21 shows a fourth exemplary configuration of the system 100 according to the present embodiment.

FIG. 21 shows a fourth exemplary configuration of the system 100 according to the present embodiment. In the system 100 according to the present embodiment, components having substantially the same operation as components in the system 100 of the third exemplary configuration shown in FIG. 15 and FIG. 16 are given the same reference numerals, and descriptions thereof are omitted.

In the first mobile object 12 of the fourth exemplary configuration, the first data transmitting section 450 may be operable to transmit the measurement data obtained by measuring the first mobile object 12 to the mobile object server 220. Furthermore, the second mobile object 14 may be operable to, in response to the second data transmitting section receiving the verification request from the first mobile object 12, transmit the detection data obtained by detecting the first mobile object 12 to the mobile object server 220. In this case, the second mobile object 14 may include a sensor 412, a data acquiring section 422 operable to acquire the measurement data of the sensor 412, and a second data transmitting section 480.

The mobile object server 220 of the fourth exemplary modification may include the first acquiring section 460, the second acquiring section 470, and the verifying section 490. The first acquiring section 460 may be operable to receive measurement data transmitted from the first data transmitting section 450. The first acquiring section 460 may be a mobile object agent MOA1. The second acquiring section 470 may be operable to acquire the detection data obtained by detecting the first mobile object 12. The second acquiring section 470 may be the mobile object agent MOA2.

The verifying section 490 may be operable to verify the validity of the measurement data, in response to the first acquiring section 460 acquiring the measurement data and the second acquiring section 470 acquiring the detection data. The reliability judging section 330 may judge the reliability of the data received from the first mobile object 12, based on the verification result from the verifying section 490, the measurement data from the first acquiring section 460, and the detection data from the second acquiring section 470. In the manner described above, the system 100 of the fourth exemplary configuration can judge the reliability of the data received from the first mobile object 12, in the same manner as the system 100 of the third exemplary configuration.

The system 100 according to the present embodiment described above is an example in which the second mobile object 14 detects the first mobile object 12 and outputs the detection data, but it is not limited to this. For example, a monitoring apparatus or the like installed on a road may detect the first mobile object 12. In this case, the monitoring apparatus may include the sensor 412, the first acquiring section 460, the second acquiring section 470, the second data transmitting section 480, the verifying section 490, and the verification result transmitting section 510. Furthermore, the monitoring apparatus may include the sensor 412, a data acquiring section operable to acquire the measurement data of the sensor 412, and the second data transmitting section 480, and the mobile object server 220 may include the first acquiring section 460, the second acquiring section 470, and the verifying section 490.

Instead, the first mobile object 12 may communicate with mobile objects of another system, mobile objects that do not access a system assisting with movement, or the like. In this case, the mobile objects that are not assisted by the system 100 may be operable to detect the first mobile object 12.

An example of the first mobile object 12 according to the present embodiment that is described above includes the sensor 410, the data acquiring section 420, the first transmitting section 430, the verification result receiving section 440, and the first data transmitting section 450 in FIG. 16. Here, the first mobile object 12 may be any mobile object 10 among the plurality of mobile objects, and therefore may further include the first acquiring section 460, the verifying section 490, and the verification result transmitting section 510. Similarly, the second mobile object 14 may further include the first transmitting section 430 and the verification result receiving section 440.

Figure 22:
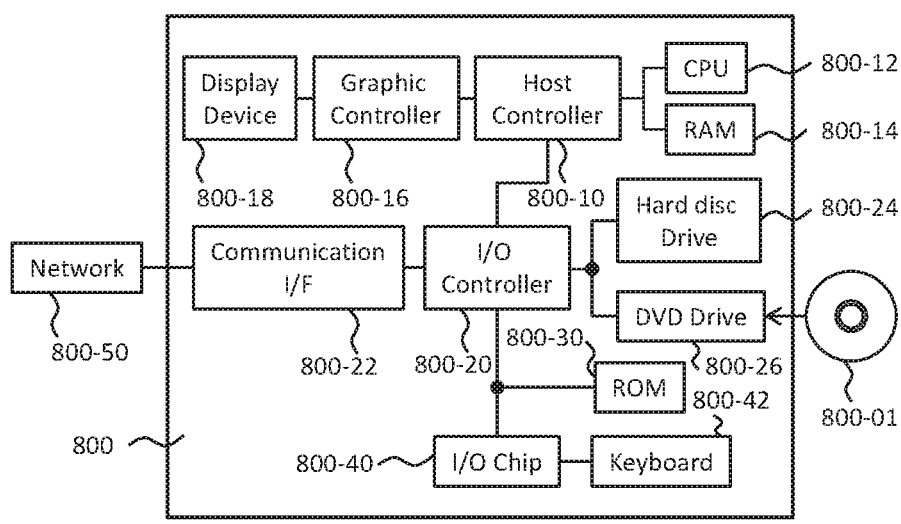
FIG. 22 shows a computer according to an embodiment of the invention.

FIG. 22 shows an exemplary hardware configuration of a computer according to the embodiment of the invention. A program that is installed in the computer 800 can cause the computer 800 to function as or perform operations associated with apparatuses of the embodiments of the present invention or one or more sections (including modules, components, elements, etc.) thereof, and/or cause the computer 800 to perform processes of the embodiments of the present invention or steps thereof. Such a program may be executed by the CPU 800-12 to cause the computer 800 to perform certain operations associated with some or all of the blocks of flowcharts and block diagrams described herein.

The computer 800 according to the present embodiment includes a CPU 800-12, a RAM 800-14, a graphics controller 800-16, and a display device 800-18, which are mutually connected by a host controller 800-10. The computer 800 also includes input/output units such as a communication interface 800-22, a hard disk drive 800-24, a DVD-ROM drive 800-26 and an IC card drive, which are connected to the host controller 800-10 via an input/output controller 800-20. The computer also includes legacy input/output units such as a ROM 800-30 and a keyboard 800-42, which are connected to the input/output controller 800-20 through an input/output chip 800-40.

The CPU 800-12 operates according to programs stored in the ROM 800-30 and the RAM 800-14, thereby controlling each unit. The graphics controller 800-16 obtains image data generated by the CPU 800-12 on a frame buffer or the like provided in the RAM 800-14 or in itself, and causes the image data to be displayed on the display device 800-18.

The communication interface 800-22 communicates with other electronic devices via a network 800-50. The hard disk drive 800-24 stores programs and data used by the CPU 800-12 within the computer 800. The DVD-ROM drive 800-26 reads the programs or the data from the DVD-ROM 800-01, and provides the hard disk drive 800-24 with the programs or the data via the RAM 800-14. The IC card drive reads programs and data from an IC card, and/or writes programs and data into the IC card.

The ROM 800-30 stores therein a boot program or the like executed by the computer 800 at the time of activation, and/or a program depending on the hardware of the computer 800. The input/output chip 800-40 may also connect various input/output units via a parallel port, a serial port, a keyboard port, a mouse port, and the like to the input/output controller 800-20.

A program is provided by computer readable media such as the DVD-ROM 800-01 or the IC card. The program is read from the computer readable media, installed into the hard disk drive 800-24, RAM 800-14, or ROM 800-30, which are also examples of computer readable media, and executed by the CPU 800-12. The information processing described in these programs is read into the computer 800, resulting in cooperation between a program and the above-mentioned various types of hardware resources. An apparatus or method may be constituted by realizing the operation or processing of information in accordance with the usage of the computer 800.

For example, when communication is performed between the computer 800 and an external device, the CPU 800-12 may execute a communication program loaded onto the RAM 800-14 to instruct communication processing to the communication interface 800-22, based on the processing described in the communication program. The communication interface 800-22, under control of the CPU 800-12, reads transmission data stored on a transmission buffering region provided in a recording medium such as the RAM 800-14, the hard disk drive 800-24, the DVD-ROM 800-01, or the IC card, and transmits the read transmission data to network 800-50 or writes reception data received from network 800-50 to a reception buffering region or the like provided on the recording medium.

In addition, the CPU 800-12 may cause all or a necessary portion of a file or a database to be read into the RAM 800-14, the file or the database having been stored in an external recording medium such as the hard disk drive 800-24, the DVD-ROM drive 800-26 (DVD-ROM 800-01), the IC card, etc., and perform various types of processing on the data on the RAM 800-14. The CPU 800-12 may then write back the processed data to the external recording medium.

Various types of information, such as various types of programs, data, tables, and databases, may be stored in the recording medium to undergo information processing. The CPU 800-12 may perform various types of processing on the data read from the RAM 800-14, which includes various types of operations, processing of information, condition judging, conditional branch, unconditional branch, search/replace of information, etc., as described throughout this disclosure and designated by an instruction sequence of programs, and writes the result back to the RAM 800-14. In addition, the CPU 800-12 may search for information in a file, a database, etc., in the recording medium. For example, when a plurality of entries, each having an attribute value of a first attribute is associated with an attribute value of a second attribute, are stored in the recording medium, the CPU 800-12 may search for an entry matching the condition whose attribute value of the first attribute is designated, from among the plurality of entries, and reads the attribute value of the second attribute stored in the entry, thereby obtaining the attribute value of the second attribute associated with the first attribute satisfying the predetermined condition.

The above-explained program or software modules may be stored in the computer readable media on or near the computer 800. In addition, a recording medium such as a hard disk or a RAM provided in a server system connected to a dedicated communication network or the Internet can be used as the computer readable media, thereby providing the program to the computer 800 via the network.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While steps of the disclosed method and components of the disclosed systems and environments have been sequentially or serially identified using numbers and letters, such numbering or lettering is not an indication that such steps must be performed in the order recited, and is merely provided to facilitate clear referencing of the method's steps. Furthermore, steps of the method may be performed in parallel to perform their described functionality.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A computer system for managing mobile objects, the computer system comprising:
   one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:
   acquiring, by a first acquiring section, measurement data obtained by a first mobile object measuring the first mobile object, using a sensor of the first mobile object;
   acquiring, by a second section, data obtained by a second mobile object detecting the first mobile object in response to a request from outside, using a sensor of the second mobile object; and
   verifying, by a verifying section, a validity of the measurement data using the detection data.

2. The computer system according to claim 1, wherein instructing the first mobile object to transmit the measurement data at a request from the second mobile object.

3. The computer system according to claim 2, wherein the second mobile object includes the first acquiring section, and the second acquiring section, and the verifying section;
   the verifying section is operable to, in response to the first acquiring section acquiring the measurement data and the request, verify the validity of the measurement data using the detection data acquired by the second acquiring section; and
   the second mobile object further includes a verification result transmitting section operable to transmit a verification result of the verifying section to the first mobile object.

4. The computer system according to claim 3, wherein the verification result transmitting section includes a signature of the second mobile object in the verification result of the verifying section and transmits the verification result including the signature to the first mobile object.

5. The computer system according to claim 3, comprising:
   a mobile object server operable to assist with movement of a plurality of mobile objects including the first mobile object and the second mobile object, and
   the first mobile object includes a first data transmitting section operable to transmit the verification result to the mobile object server.

6. The computer system according to claim 5, wherein the mobile object server includes a reliability judging section operable to judge the reliability of the first mobile object based on one or more of the verification results obtained by verifying the measurement data of the first mobile object.

7. The computer system according to claim 6, wherein the mobile object server includes a mobile object determining section operable to determine a mobile object for which the reliability is to be judged; and
   the first mobile object is operable to transmit the measurement data and the request to the second mobile object, in response to instructions from the mobile object determining section.

8. The computer system according to claim 5, wherein the second mobile object includes a second data transmitting section operable to transmit the detection data acquired by the second acquiring section to the mobile object server.

9. The computer system according to claim 2, comprising:
   a mobile object server operable to assist with movement of a plurality of mobile objects including the first mobile object and the second mobile object, wherein
   the first mobile object includes a first data transmitting section operable to transmit measurement data obtained by measuring the first mobile object to the mobile object server, the second mobile object includes a second data transmitting section operable to transmit detection data obtained by detecting the first mobile object to the mobile object server, in response to receiving the request from the first mobile object, the mobile object server includes the first acquiring section, the second acquiring section, and the verifying section, and the verifying section is operable to, in response to the first acquiring section acquiring the measurement data and the second acquiring section acquiring the detection data, verify the validity of the measurement data.

10. A method for managing mobile objects, the method comprising:

acquiring measurement data obtained by a first mobile object measuring the first mobile object, using a sensor of the first mobile object;

acquiring detection data obtained by a second mobile object detecting the first mobile object in response to a request from outside, using a sensor of the second mobile object; and verifying validity of the measurement data using the detection data.

11. The method according to claim 10, comprising:

instructing the first mobile object to transmit the measurement data and the request to the second mobile object.

12. The method according to claim 11, wherein the first acquisition, the second acquisition, and the verification are performed by the second mobile object, and verifying the validity of the measurement data using the detection data.

13. The method according to claim 12, wherein the verification result transmission includes a signature of the second mobile object in the verification result, and transmitting the verification result and the signature to the first mobile object.

14. The method according to claim 12, comprising:

judging reliability of the first mobile object based on one or more of the verification results obtained by verifying the measurement data of the first mobile object.

15. The method according to claim 11, comprising:

assisting, by a mobile object server, with movement of a plurality of mobile objects including the first mobile object and the second mobile object, wherein the first mobile object transmits measurement data obtained by measuring the first mobile object to the mobile object server, the second mobile object transmits detection data obtained by detecting the first mobile object to the mobile object server, in response to receiving the request from the mobile object server, and the first acquisition, the second acquisition, and the verification are performed by the mobile object server.

16. A computer program product for managing mobile objects, the computer program product comprising:

one or more computer-readable tangible storage medium and program instructions stored on at least one of the one or more tangible storage medium, the program instructions executable by a processor, the program instructions comprising:

program instructions to acquire measurement data obtained by a first mobile object measuring the first mobile object, using a sensor of the first mobile object;

program instructions to acquire detection data obtained by a second mobile object detecting the first mobile object in response to a request from outside, using a sensor of the second mobile object; and program instructions to verify validity of the measurement data using the detection data.

17. The computer program product according to claim 16 further comprising:

program instructions to verify the validity of the measurement data using the detection data; and program instructions to determine a reliability of the first mobile object based on one or more verification results.

18. The computer program product according to claim 16, wherein a verification result includes a signature of the second mobile object.

19. The computer program product according to claim 17 further comprising:

program instructions to determine a mobile object for which reliability is to be judged; and program instructions to instruct the determined mobile object to verify validity of measurement data obtained by measuring the mobile object.

* * * * *